(12) United States Patent
Baude et al.

(10) Patent No.: US 7,297,361 B2
(45) Date of Patent: *Nov. 20, 2007

(54) IN-LINE DEPOSITION PROCESSES FOR CIRCUIT FABRICATION

(75) Inventors: Paul F. Baude, Maplewood, MN (US); Patrick R. Fleming, Lake Elmo, MN (US); Michael A. Haase, St. Paul, MN (US); Tommie W. Kelley, Coon Rapids, MN (US); Dawn V. Muyres, St. Paul, MN (US); Steven Theiss, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 60 days.

This patent is subject to a terminal disclaimer.

(21) Appl. No.: 10/940,448

(22) Filed: Sep. 14, 2004

(65) Prior Publication Data
US 2005/0042365 A1 Feb. 24, 2005

Related U.S. Application Data

(62) Division of application No. 10/076,005, filed on Feb. 14, 2002, now Pat. No. 6,821,348.

(51) Int. Cl.
*B05D 5/12* (2006.01)
*B05D 1/32* (2006.01)

(52) U.S. Cl. .................. 427/98.4; 427/96.1; 427/96.8; 427/248.1; 427/282

(58) Field of Classification Search ............... 427/98.4, 427/96.1, 96.8, 248.1, 282
See application file for complete search history.

(56) References Cited

U.S. PATENT DOCUMENTS

| | | | |
|---|---|---|---|
| 3,669,060 A | 6/1972 | Page et al. | |
| 3,683,847 A | 8/1972 | Carleton | |
| 3,735,728 A | 5/1973 | Krumme et al. | |
| 3,995,283 A | 11/1976 | Dougherty | |
| 4,096,821 A | 6/1978 | Greeneich et al. | |
| 4,278,528 A | 7/1981 | Kuehnle et al. | |
| 4,335,161 A | 6/1982 | Luo | |
| 4,369,730 A | 1/1983 | Izu et al. | |
| 4,389,970 A | 6/1983 | Edgerton | |

(Continued)

FOREIGN PATENT DOCUMENTS

DE    3128982 C2    2/1983

(Continued)

OTHER PUBLICATIONS

Brody, "Large Area Masking Techniques for Thin Film Transistor Arrays," SPIE, vol. 100, Semiconductor Microlithography II, pp. 140-150(1977).

(Continued)

*Primary Examiner*—Bret Chen
(74) *Attorney, Agent, or Firm*—Lisa P. Fulton

(57) ABSTRACT

A method for circuit fabrication includes positioning first and second webs of film in proximity to each other, wherein the second web of film defines a deposition mask, and deposition material on the first web of film through the deposition mask pattern defined by the second web of the to create at least a portion of an integrated circuit.

20 Claims, 14 Drawing Sheets

U.S. PATENT DOCUMENTS

| | | | |
|---|---|---|---|
| 4,519,339 A | 5/1985 | Izu et al. | |
| 4,542,711 A | 9/1985 | Izu et al. | |
| 4,585,537 A * | 4/1986 | Nakayama et al. | 427/570 |
| 4,676,193 A | 6/1987 | Martin | |
| 4,677,738 A * | 7/1987 | Izu et al. | 438/62 |
| 4,679,311 A | 7/1987 | Lakhani et al. | |
| 4,684,435 A | 8/1987 | Kishi et al. | |
| 4,746,548 A | 5/1988 | Boudreau et al. | |
| 4,883,359 A * | 11/1989 | Ina et al. | 356/401 |
| 4,915,057 A | 4/1990 | Boudreau et al. | |
| 4,937,121 A | 6/1990 | Maligie | |
| 4,963,921 A | 10/1990 | Kariya et al. | |
| 5,122,392 A * | 6/1992 | Takeuchi et al. | 427/129 |
| 5,154,797 A | 10/1992 | Blomquist et al. | |
| 5,304,274 A | 4/1994 | Crownover et al. | |
| 5,382,773 A | 1/1995 | Kurihara et al. | |
| 5,397,607 A | 3/1995 | Shields et al. | |
| 5,534,969 A | 7/1996 | Miyake | |
| 5,539,153 A | 7/1996 | Schwiebert et al. | |
| 5,556,590 A | 9/1996 | Hull | |
| 5,626,784 A | 5/1997 | Simons | |
| 5,682,228 A | 10/1997 | Miyake | |
| 5,710,619 A * | 1/1998 | Jain et al. | 355/50 |
| 5,716,742 A | 2/1998 | Doran | |
| 5,728,224 A | 3/1998 | Laurent et al. | |
| 5,946,551 A | 8/1999 | Dimitrakopoulos et al. | |
| 6,071,597 A * | 6/2000 | Yang et al. | 428/209 |
| 6,087,196 A | 7/2000 | Sturm et al. | |
| 6,091,196 A | 7/2000 | Codama | |
| 6,106,627 A | 8/2000 | Yializis | |
| 6,224,448 B1 | 5/2001 | Tada et al. | |
| 6,255,775 B1 | 7/2001 | Ikuko et al. | |
| 6,259,408 B1 | 7/2001 | Brady et al. | |
| 6,285,001 B1 | 9/2001 | Fleming et al. | |
| 6,403,397 B1 | 6/2002 | Katz | |
| 6,413,790 B1 | 7/2002 | Duthaler et al. | |
| 6,447,612 B1 * | 9/2002 | Moriyama et al. | 118/718 |
| 6,455,931 B1 * | 9/2002 | Hamilton et al. | 257/723 |
| 6,589,382 B2 | 7/2003 | Clark et al. | |
| 6,603,453 B2 | 8/2003 | Yamazaki et al. | |
| 6,660,437 B2 * | 12/2003 | Friedrich et al. | 430/5 |
| 6,667,215 B2 * | 12/2003 | Theiss et al. | 438/299 |
| 6,897,164 B2 * | 5/2005 | Baude et al. | 438/780 |
| 2001/0002583 A1 | 6/2001 | Eller | |
| 2001/0023090 A1 | 9/2001 | Lee | |
| 2001/0026975 A1 | 10/2001 | Ando | |
| 2002/0062785 A1 | 5/2002 | Kim et al. | |
| 2002/0102811 A1 | 8/2002 | Farrow et al. | |
| 2002/0110733 A1 * | 8/2002 | Johnson | 429/149 |
| 2002/0111035 A1 | 8/2002 | Atobe et al. | |
| 2003/0016025 A1 | 1/2003 | Martter et al. | |
| 2003/0091751 A1 * | 5/2003 | Tsuruta et al. | 427/487 |
| 2003/0150384 A1 | 8/2003 | Baude et al. | |
| 2003/0151118 A1 | 8/2003 | Baude et al. | |
| 2003/0152691 A1 | 8/2003 | Baude et al. | |
| 2004/0087009 A1 * | 5/2004 | Schembri | 435/287.2 |
| 2004/0106262 A1 | 6/2004 | Theiss et al. | |
| 2004/0131761 A1 * | 7/2004 | Shakespeare | 427/58 |
| 2004/0150804 A1 * | 8/2004 | Iizuka et al. | 355/53 |
| 2005/0106986 A1 * | 5/2005 | Cok et al. | 445/58 |

FOREIGN PATENT DOCUMENTS

| | | |
|---|---|---|
| EP | 0 118 576 A1 | 9/1984 |
| EP | 0 719 638 A2 | 7/1996 |
| EP | 1 003 221 A2 | 5/2000 |
| EP | 1 036 858 A1 | 9/2000 |
| GB | 2 276 589 A | 10/1994 |
| JP | 54-65764 | 5/1979 |
| JP | 61-130480 | 6/1986 |
| JP | 5-78818 A | 3/1993 |
| JP | 5-228669 | 9/1993 |
| JP | 9-27454 | 1/1997 |
| WO | WO 99/09456 | 2/1999 |
| WO | WO 99/30336 | 6/1999 |
| WO | WO 99/39373 | 8/1999 |
| WO | WO 99/54786 | 10/1999 |

OTHER PUBLICATIONS

Weimer, "The TFT—A New Thin-Film Transistor," Proceedings of the IRE, pp. 1462-1469(1962).

Brody et al., "Flexible Thin-Film Transistors Stretch Performance, Shrink Cost," Research, (1969), pp. 20-23.

Schon et al., "Fast Organic Electronic Circuits Based on Ambipolar Pentacene Field-Effect Transistors," Applied Physics Letters, (2001), pp. 4043-4044, vol. 79, No. 24.

Gouy et al., "Deposition of Organic Semiconductor Through Silicon Shadow Masks for Integrated Led of Silicon", Rapport Scientifique, (2001), pp. 1-4.

Kim et al., "Photoplastic Shadow-Masks for Rapid Resistless Multi-Layer Micropatterning", The 11th International Conference on Solid-State Sensors and Actuators, (Jun. 10-14, 2001), pp. 1632-1635, Munich, Germany.

Kim et al., "Dry-Lift-Off Patterning on Fragile Surfaces Using MEMS Shadow Masks", The 14th European Conference on Solid-State Transducers, (Aug. 27-30, 2000), pp. 619-622, Copenhagen, Denmark.

* cited by examiner

IN-LINE DEPOSITION PROCESSES FOR CIRCUIT FABRICATION

This application is a divisional of U.S. Ser. No. 10/076005 now U.S. Pat. No. 6,821,348, filed Feb. 14, 2002, now allowed, the disclosure of which is herein incorporated by reference.

TECHNICAL FIELD

The invention relates to fabrication of circuits and circuit elements, and more particularly to deposition techniques using aperture masks.

BACKGROUND

Circuits include combinations of resistors, diodes, capacitors and transistors linked together by electrical connections. Thin film integrated circuits include a number of layers such as metal layers, dielectric layers, and active layers typically formed by a semiconductor material such as silicon. Typically, thin film circuit elements and thin film integrated circuits are created by depositing various layers of material and then patterning the layers using photolithography in an additive or subtractive process which can include a chemical etching step to define various circuit components. Additionally, aperture masks have been used to deposit a patterned layer without an etching step or any photolithography.

SUMMARY

In general, the invention is directed to deposition techniques using aperture mask patterns formed in one or more elongated webs of flexible film. The techniques involve sequentially depositing material through aperture mask patterns formed in the webs to define layers, or portions of layers, of a circuit. A deposition substrate can also be formed from an elongated web, and the deposition substrate web can be fed through a series of deposition stations. Each deposition station may have its own elongated web formed with aperture mask patterns. In some embodiments, each elongated web of aperture mask patterns travels in a direction perpendicular to the deposition substrate web. In this manner, the circuit fabrication process can be performed in-line. Moreover, the process can be automated to reduce human error and increase throughput.

In some embodiments, circuits can be created solely using aperture mask deposition techniques, without requiring any of the etching or photolithography steps typically used to form integrated circuit patterns. Aperture mask deposition techniques can be particularly useful in fabricating circuit elements for low-cost integrated circuits such as radio frequency identification (RFID) circuits or for fabricating circuits for electronic displays such as liquid crystal displays or organic light emitting diode displays. In addition, the techniques can be advantageous in the fabrication of integrated circuits incorporating organic semiconductors, which typically are not compatible with etching processes or photolithography.

In one embodiment, the invention is directed to an aperture mask comprising an elongated web of flexible film, and a deposition mask pattern formed in the film, wherein the deposition mask pattern defines deposition apertures that extend through the film. The elongated web may be greater than approximately 50 centimeters or greater than approximately 100 centimeters or greater than approximately 10 meters, or greater than approximately 100 meters in length.

The mask can be sufficiently flexible such that it can be wound into a roll without damage or forming a permanent bend. Also, the aperture mask may be reusable. Aperture masks in this form can be used as part of an in-line deposition system.

In other embodiments, the invention is directed to in-line deposition systems and in-line deposition methods. For example, a system may include a first web of flexible film and a second web of flexible film, wherein the second web of film defines a deposition mask pattern. The system may also include a drive mechanism that moves at least one of the first and second webs relative to the other of the first and second webs, and a deposition unit that deposits onto the first web of film through the deposition mask pattern defined by the second web of film. Various in-line deposition methods are also described.

In additional embodiments, the invention is directed to a stretching apparatus for aligning a deposition mask pattern with a substrate in an in-line deposition system. For example, the apparatus may include a first stretching mechanism to stretch the first web of film in a down-web direction, a cross-web direction, or both directions in order to align the deposition mask pattern formed in the first web of film with a deposition substrate. The deposition substrate may also form a web, or alternatively may be a conveyance web carrying a series of substrates. The second web of film may also be stretched in the down-web direction, cross-web direction, or both directions.

The various embodiments of the invention can provide one or more advantages. For example, the invention can facilitate the fabrication of relatively small circuit elements using aperture mask deposition techniques. For example, the invention can facilitate fabrication of circuit elements having widths less than approximately 1000 microns, less than approximately 50 microns, less than approximately 20 microns, less than approximately 10 microns, or even less than approximately 5 microns. In addition, the invention can reduce costs associated with circuit fabrication. Specifically, by streamlining the circuit fabrication process such that deposition can be performed in-line, circuits may be created more quickly and with a reduced number of handling steps. Moreover, by reducing human error, an automated process may produce more reliable circuits than other processes. In this manner, an in-line process can promote increased yields.

Also, because the elongated web may be formed from polymeric material, the aperture masks in the web can be created using laser ablation techniques. Laser ablation techniques may be faster and less expensive than other mask creation techniques. Also, inexpensive polymeric materials can allow the elongated web of masks to be disposable. Laser ablation techniques allow for the fabrication of small deposition apertures, i.e., with widths less than approximately 1000 microns, less than approximately 50 microns, less than approximately 20 microns, 10 microns, or even 5 microns. In addition, laser ablation techniques allow for the creation of deposition apertures separated by a small gap, i.e., less than approximately 1000 microns, less than approximately 50 microns, less than approximately 20 microns, or even less than approximately 10 microns. These small deposition apertures and small gaps can facilitate the fabrication of small circuit elements. Additionally, laser ablation techniques can facilitate the fabrication of aperture mask patterns over large surface areas allowing large area circuits or widely spaced circuit elements to be fabricated.

Another advantage is that the polymeric material that makes up the web of aperture masks may be well suited to be impregnated with magnetic material. In that case, the magnetic material may be used to reduce sag during the in-line deposition process, e.g., by application of attractive or repulsive magnetic force. Furthermore, polymeric material is often stretchable, which allows the mask to be stretched in order to better align the mask with the deposition substrate and possibly to control sag. Stretching techniques in the down-web direction, the cross-web direction, or both may be used to achieve quick and precise alignment of the elongated web of aperture masks relative to the elongated web of deposition substrate material.

Details of these and other embodiments of the invention are set forth in the accompanying drawings and the description below. Other features, objects, and advantages of the invention will become apparent from the description and drawings, and from the claims.

BRIEF DESCRIPTION OF DRAWINGS

FIG. 2b is an enlarged view of a portion of the aperture mask in FIG. 2a.

DETAILED DESCRIPTION

Figure 1:
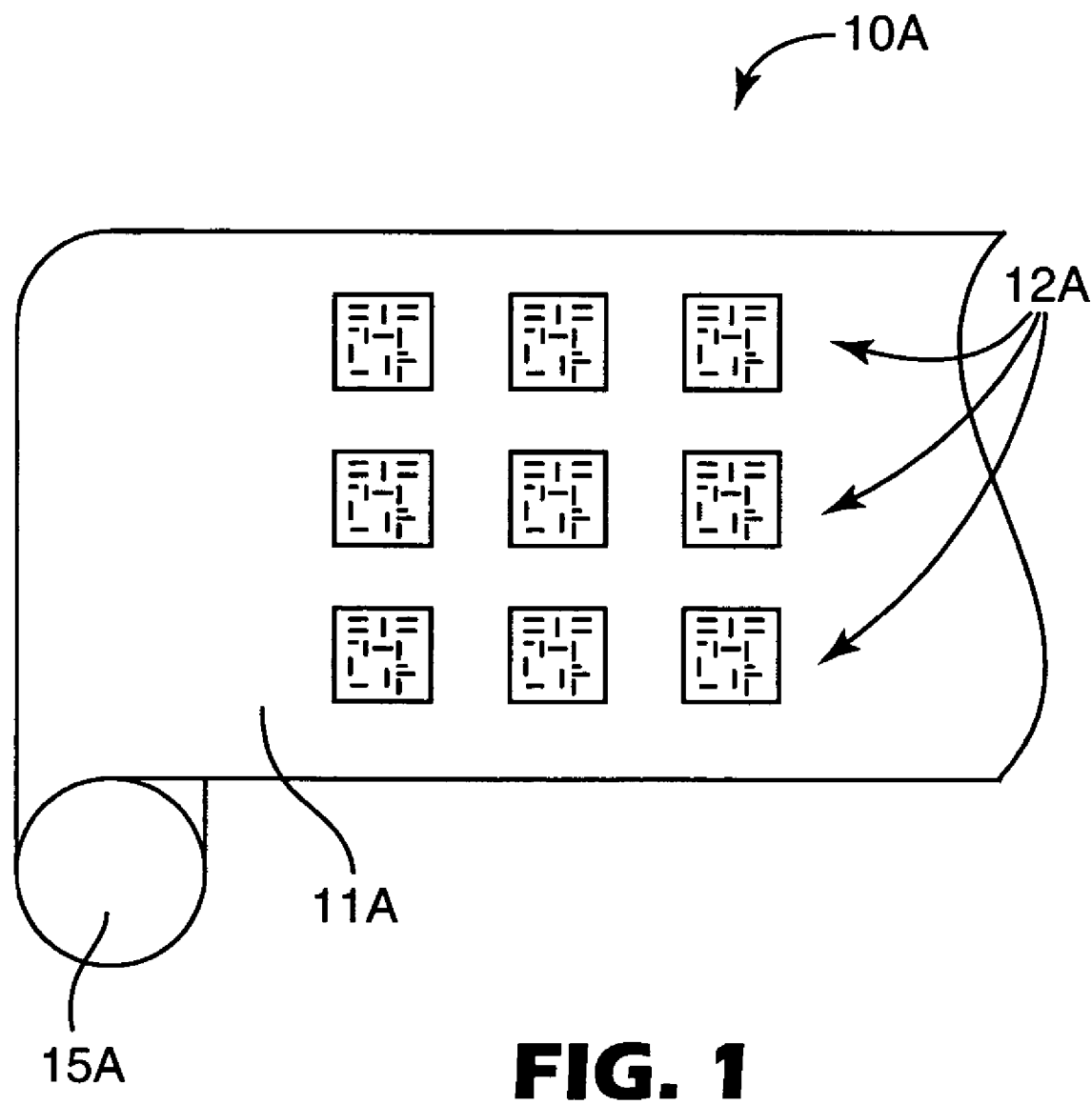
FIG. 1 is a perspective view of an aperture mask in the form of an aperture mask web wound into a roll.

FIG. 1 is a perspective view of an aperture mask 10A. As shown, aperture mask 10A includes an elongated web of flexible film 11A, and a deposition mask pattern 12A formed in the film. The deposition mask pattern 12A defines deposition apertures (not labeled in FIG. 1) that extend through the film. Typically, aperture mask 10A is formed with a number of deposition mask patterns, although the invention is not necessarily limited in that respect. In that case, each deposition mask pattern may be substantially the same, or alternatively, two or more different mask patterns may be formed in flexible film 11A.

As shown, flexible film 11A may be sufficiently flexible such that it can be wound to form a roll 15A without damage. The ability to wind flexible film 11A onto a roll provides a distinct advantage in that the roll of film 15A has a substantially compact size for storage, shipping and use in an inline deposition station. Also, flexible film 11A may be stretchable such that it can be stretched to achieve precise alignment. For example, the flexible film may be stretchable in a cross-web direction, a down-web direction, or both. In exemplary embodiments, flexible film 11A may comprise a polymeric film. The polymeric film may be comprised of one or more of a wide variety of polymers including polyimide, polyester, polystyrene, polymethyl methacrylate, polycarbonate, or other polymers. Polyimide is a particularly useful polymer for flexible film 11A.

Aperture mask 10A is subject to a wide variety of shapes and sizes. For example, in exemplary embodiments, a web of flexible film 11A is at least approximately 50 centimeters in length or 100 centimeters in length, and in many cases, may be at least approximately 10 meters, or even 100 meters in length. Also, the web of flexible film 11A may be at least approximately 3 cm in width, and less than approximately 200 microns in thickness, less than approximately 30 microns, or even less than approximately 10 microns in thickness.

Figure 2A:
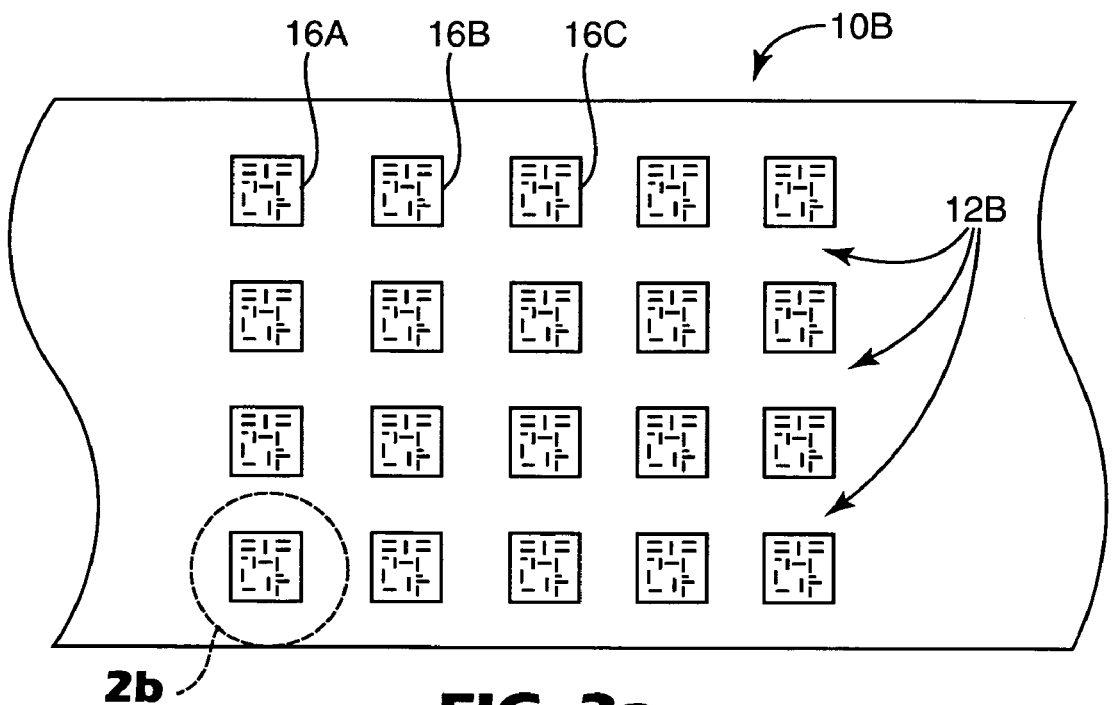
FIG. 2a is a top view of an aperture mask according to an embodiment of the invention.

FIG. 2a is a top view of a portion of an aperture mask 10B according to the invention. In exemplary embodiments, aperture mask 10B as shown in FIG. 2a is formed from a polymer material. However, other flexible non-polymeric materials may also be used. The use of polymeric materials for aperture mask 10B can provide advantages over other materials, including ease of fabrication of aperture mask 10B, reduced cost of aperture mask 10B, and other advantages. As compared to thin metal aperture masks, polymer aperture masks are much less prone to damage due to accidental formation of creases and permanent bends. Furthermore, some polymer masks can be cleaned with acids.

Figure 2B:
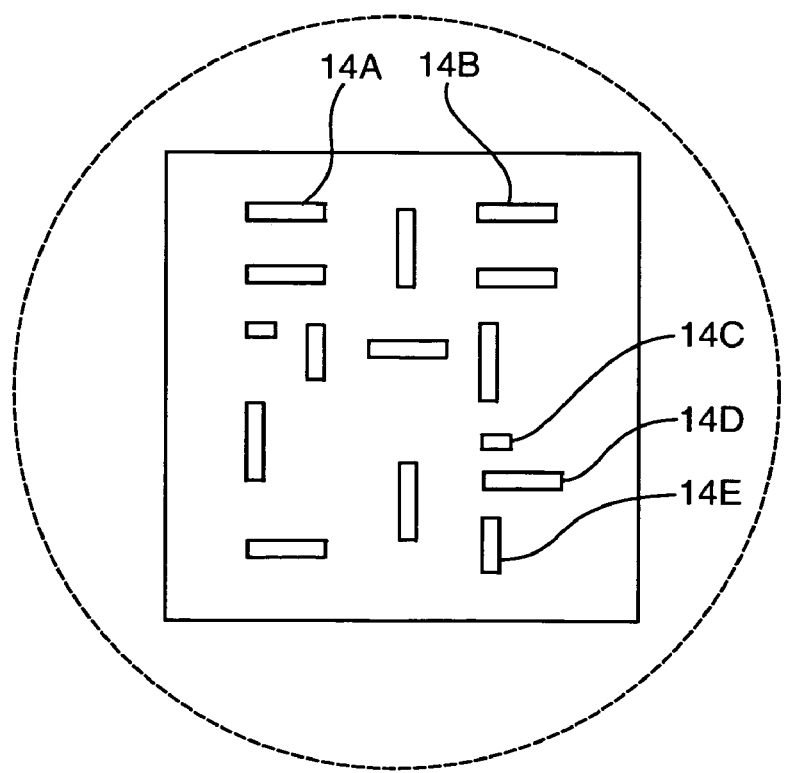

As shown in FIGS. 2a and 2b, aperture mask 10B is formed with a pattern 12B that defines a number of deposition apertures 14 (only deposition apertures 14A-14E are labeled). The arrangement and shapes of deposition apertures 14A-14E in FIG. 2b are simplified for purposes of illustration, and are subject to wide variation according to the application and circuit layout envisioned by the user. Pattern 12B defines at least a portion of a circuit layer and may generally take any of a number of different forms. In other words, deposition apertures 14 can form any pattern, depending upon the desired circuit elements or circuit layer to be created in the deposition process using aperture mask 10B. For example, although pattern 12B is illustrated as including a number of similar sub-patterns (sub-patterns 16A-16C are labeled), the invention is not limited in that respect.

Aperture mask 10B can be used in a deposition process, such as a vapor deposition process in which material is deposited onto a deposition substrate through deposition apertures 14 to define at least a portion of a circuit. Advantageously, aperture mask 10B enables deposition of a desired material and, simultaneously, formation of the material in a desired pattern. Accordingly, there is no need for a separate patterning step following or preceding deposition. Aperture mask 10B may be used to create a wide variety of integrated circuits, such as integrated circuits which include a complimentary (both n-channel and p-channel) transistor element. In addition, organic (e.g., pentacene) or inorganic (e.g., amorphous silicon) semiconductor materials may be used to create integrated circuits according to the invention. For some circuits, both organic and inorganic semiconductors may be used.

Aperture mask 10B can be particularly useful in creating circuits for electronic displays such as liquid crystal displays or organic light emitting displays, low-cost integrated circuits such as RFID circuits, or any circuit that implements thin film transistors. Moreover, circuits that make use of organic semiconductors can benefit from various aspects of the invention as described in greater detail below. In addition, because aperture mask 10B can be formed out of a flexible web of polymeric material, it can be used in an in-line process as described in greater detail below.

One or more deposition apertures 14 can be formed to have widths less than approximately 1000 microns, less than approximately 50 microns, less than approximately 20 microns, less than approximately 10 microns, or even less than approximately 5 microns. By forming deposition apertures 14 to have widths in these ranges, the sizes of the circuit elements may be reduced. Moreover, a distance (gap) between two deposition apertures (such as for example the distance between deposition aperture 14C and 14D) may be less than approximately 1000 microns, less than approximately 50 microns, less than approximately 20 microns or less than approximately 10 microns, to reduce the size of various circuit elements.

Laser ablation techniques can be used to define pattern 12B of deposition apertures 14. Accordingly, formation of aperture mask 10B from a web of polymeric film can allow the use of fabrication processes that can be less expensive, less complicated, and/or more precise than those generally required for other aperture masks such as silicon masks or metallic masks. Moreover, because laser ablation techniques can be used to create pattern 12B, the width of pattern 12B can be made much larger than conventional patterns. For example, laser ablation techniques can facilitate the creation of pattern 12B such that a width of pattern 12B is greater than approximately a centimeter, greater than approximately 25 centimeters, greater than approximately 100 centimeters, or even greater than approximately 500 centimeters. These large masks can then be used in a deposition process to create circuit elements that are distributed over a large surface area and separated by large distances. Moreover, by forming the mask on a large polymeric web, the creation of large integrated circuits can be done in an in-line process.

Figure 3:
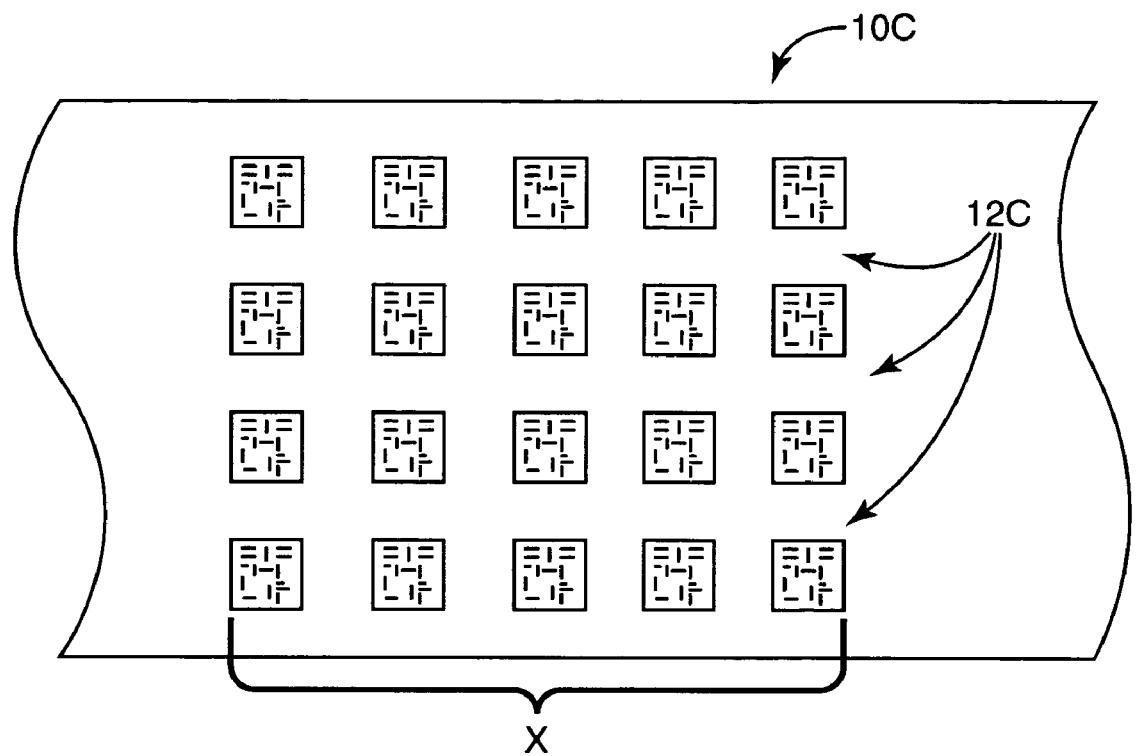
FIGS. 3-5 are top views of aperture masks according to embodiments of the invention.
Figure 4:
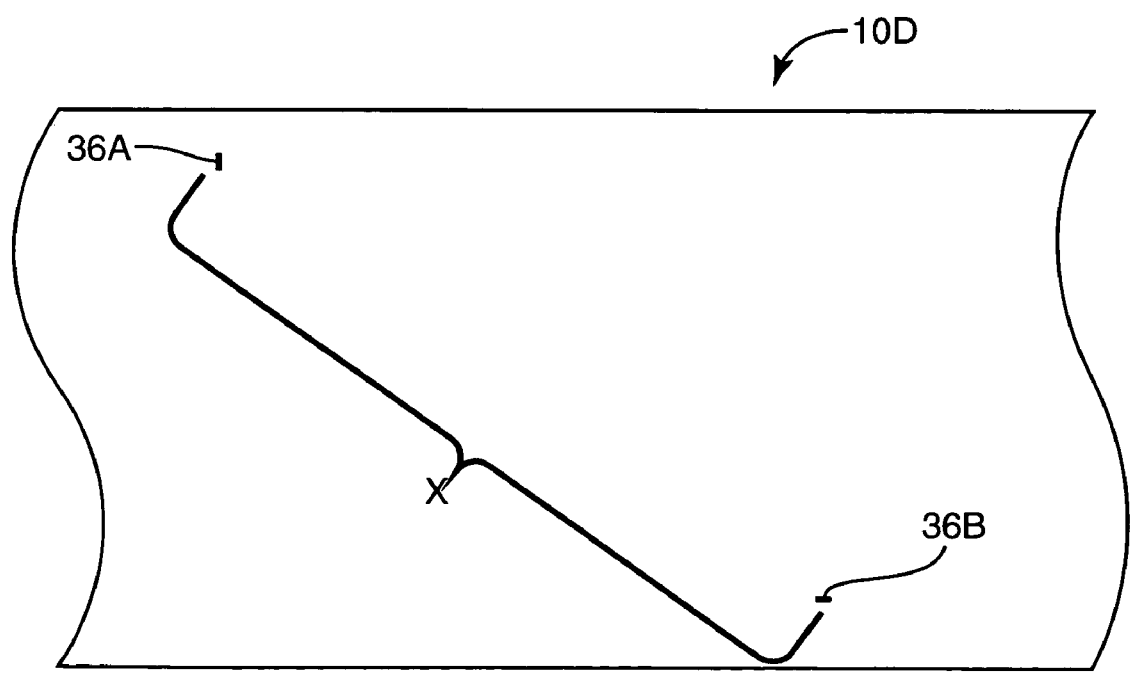

FIGS. 3 and 4 are top views of aperture masks 10C and 10D that include deposition apertures separated by relatively large widths. Still, aperture masks 10C and 10D are formed out of a web of film to allow the deposition processes to be conducted in-line. FIG. 3 illustrates aperture mask 10C, which includes a pattern 12C of deposition apertures. Pattern 12C may define at least one dimension that is greater than approximately a centimeter, greater than approximately 25 centimeters, greater than approximately 100 centimeters, or even greater than approximately 500 centimeters. In other words, the distance X may be within those ranges. In this manner, circuit elements separated by larger than conventional distances can be created using a deposition process. This feature may be advantageous, for example, in the fabrication of large area flat panel displays or detectors.

For some circuit layers, complex patterns may not be required. For example, aperture mask 10D of FIG. 4 includes at least two deposition apertures 36A and 36B. In that case, the two deposition apertures 36A and 36B can be separated by a distance X that is greater than approximately a centimeter, 25 centimeters, 100 centimeters, or even greater than approximately 500 centimeters. Again, laser ablation techniques can facilitate the relatively large distance X because laser ablation systems can be easily designed to facilitate the large areas. Moreover, laser ablation techniques can facilitate the creation of deposition apertures 36A and 36B to widths less than approximately 1000 microns, less than approximately 50 microns, less than approximately 20 microns, less than 10 microns, or even less than 5 microns. In that case, the deposition process would not necessarily require the aperture mask to be registered or aligned to a tolerance as small as the aperture widths. Still, the ability to deposit and pattern a circuit layer in a single deposition process with elements separated by these large distances can be highly advantageous for creating circuits that require large separation between two or more elements. Circuits for controlling or forming pixels of large electronic displays are one example.

Figure 5:
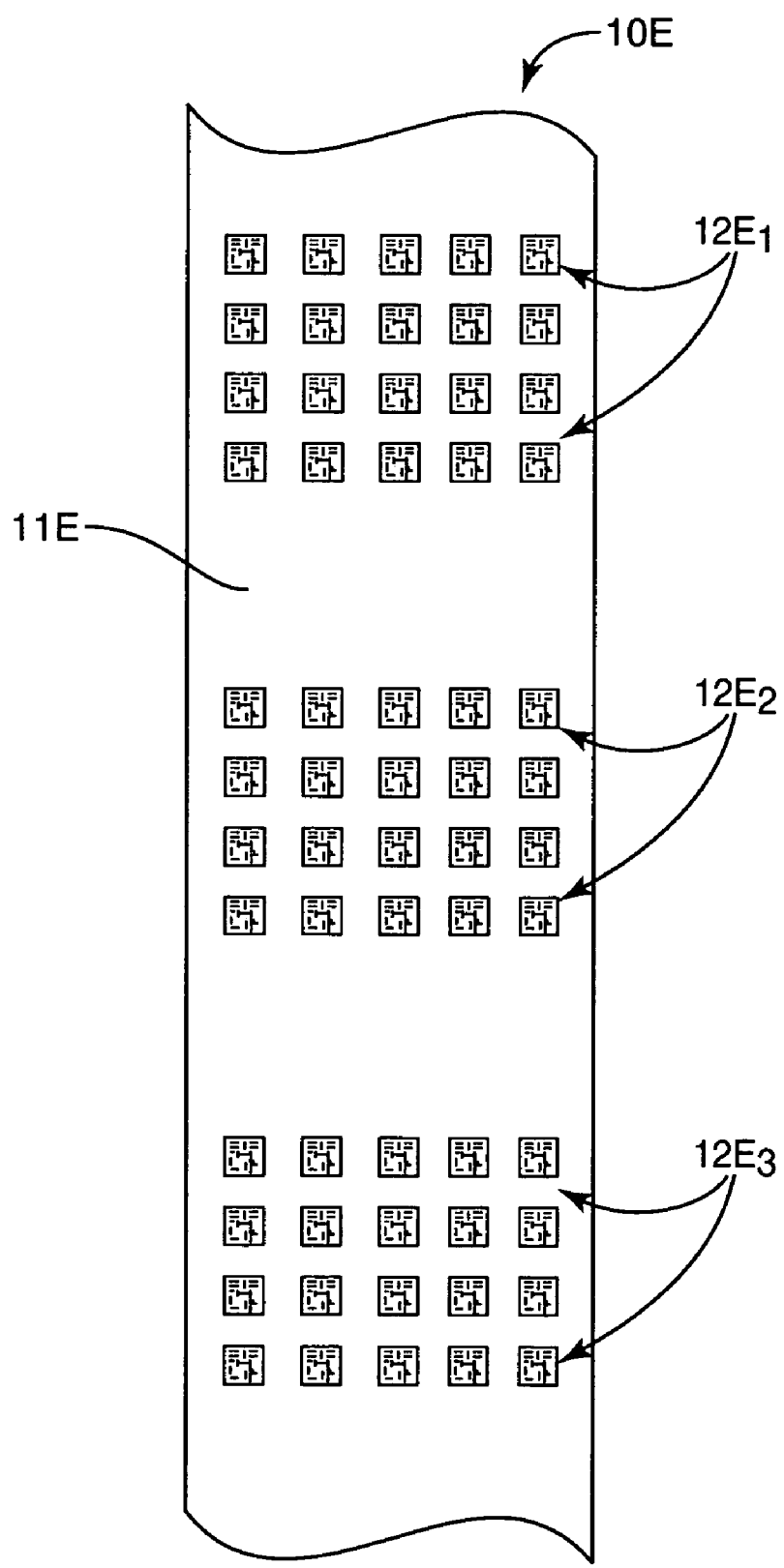

FIG. 5 is a top view of aperture mask 10E. As shown, aperture mask 10E is formed in a web of flexible material 11E, such as a polymeric material. Aperture mask 10E defines a number of patterns $12E_1$-$12E_3$. In some cases, the different patterns 12E may define different layers of a circuit, and in other cases, the different patterns 12E define different portions of the same circuit layer. In some cases, stitching techniques can be used in which first and second patterns $12E_1$ and $12E_2$ define different portions of the same circuit feature. In other words, two or more patterns may be used for separate depositions to define a single circuit feature. Stitching techniques can be used, for example, to avoid relatively long deposition apertures, closed curves, or any aperture pattern that would cause a portion of the aperture mask to be poorly supported, or not supported at all. In a first deposition, one mask pattern forms part of a feature, and in a second deposition, another mask pattern forms the remainder of the feature.

In still other cases, the different patterns 12E may be substantially the same. In that case, each of the different patterns 12E may be used to create substantially similar deposition layers for different circuits. For example, in an in-line web process, a web of deposition substrates may pass perpendicular to aperture mask 10E. After each deposition, the web of deposition substrates may move in-line for the next deposition. Thus, pattern $12E_1$ can be used to deposit a layer on the web of deposition substrates, and then $12E_2$ can be used in a similar deposition process further down the web of deposition substrates. Each portion of aperture mask 10E containing a pattern may also be reused on a different portion of the deposition substrate or on one or more different deposition substrates. More details of an in-line deposition system are described below.

Figure 6:
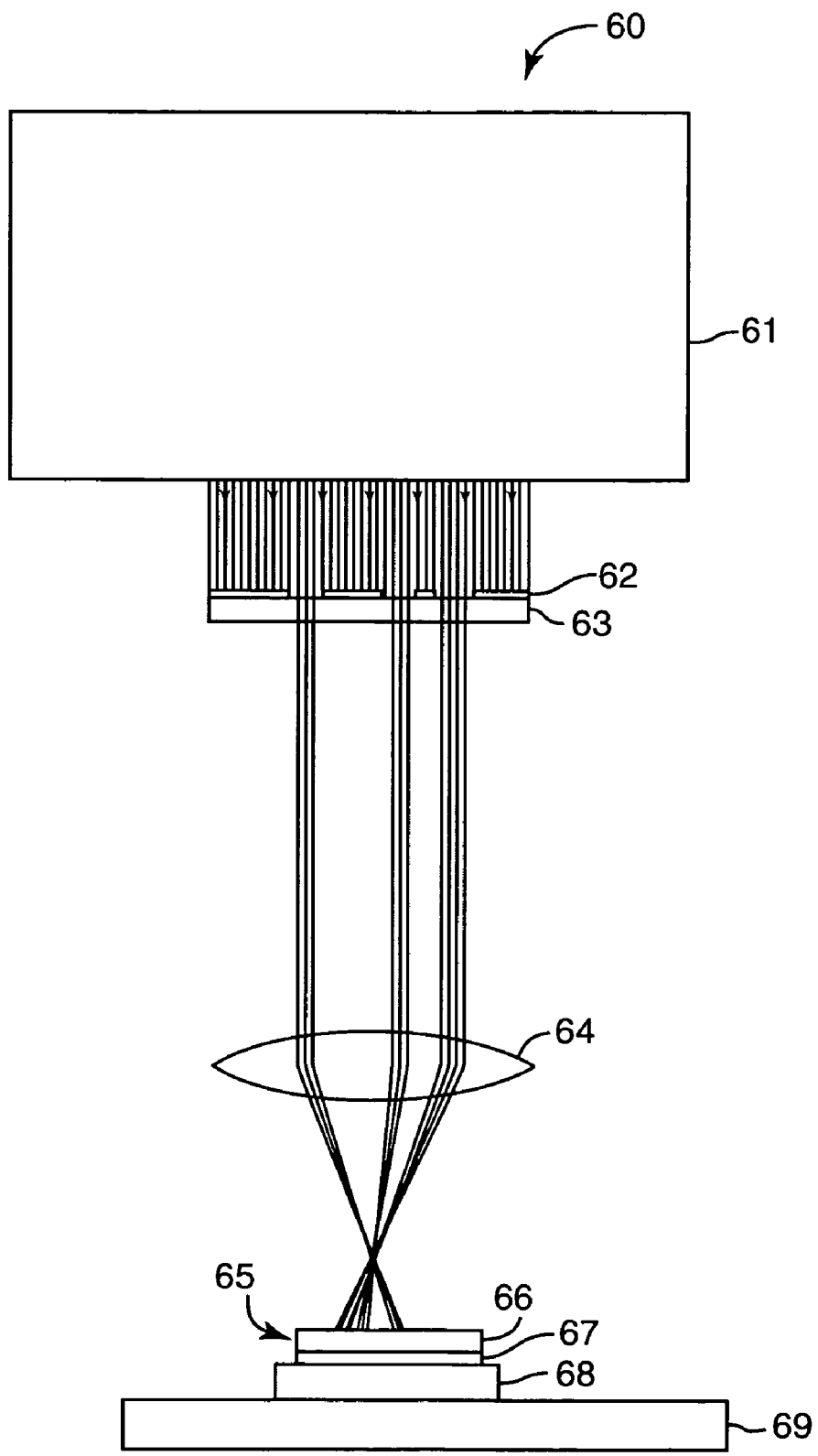
FIG. 6 is a block diagram of a laser ablation system that can be used to ablate aperture mask webs in accordance with the invention.

FIG. 6 is a block diagram of a laser ablation system that can be used to ablate aperture masks in accordance with the invention. Laser ablation techniques are advantageous because they can achieve relatively small deposition apertures and can also define patterns on a single aperture mask that are much larger than conventional patterns. In addition, laser ablation techniques may facilitate the creation of aperture masks at significantly lower cost than other conventional techniques commonly used to create metal or silicon aperture masks.

As illustrated in FIG. 6, laser ablation system 60 may be a projection laser ablation system utilizing a patterned ablation mask, although a shadow mask ablation system or phase mask ablation system could also be used. Projection imaging laser ablation is a technique for producing very small parts or very small structures on a surface of an object being ablated, the structures having sizes on the order of between one micron to several millimeters. In that case, light is passed through a patterned ablation mask and the pattern is imaged onto the object being ablated. Material is removed from the ablation substrate in the areas that receive radiation. Although the system is described using an ultraviolet (UV) laser, the illumination provided by the laser can be any kind of radiation having energy sufficient for ablation, such as infrared or visible light. Moreover, the invention can, in principle, be applied using radiation from sources other than lasers.

Laser 61 may be a KrF excimer laser emitting a beam with a short wavelength of light of approximately 248 nm. However, any type of excimer laser may be used, such as $F_2$, ArF, KrCl, or XeCl type excimer lasers. An excimer laser is particularly useful in creating small deposition apertures because an excimer laser can resolve smaller features and cause less collateral damage than lasers such as $CO_2$ lasers, which emit beams with a wavelength of approximately 10,600 nm. Also, excimer lasers can be used with most polymers that are transparent to light from lasers typically used for processing metals, such as Neodymium doped Yttrium Aluminum Garnet (Nd:YAG) lasers. Excimer lasers are also advantageous because at UV wavelengths, most materials, such as polymers, have high absorption. Therefore, more energy is concentrated in a shallower depth and the excimer laser provides cleaner cutting. Excimer lasers are pulsed lasers, the pulses ranging from 5-300 nanoseconds. Laser 61 may also be a tripled or quadrupled Nd:YAG laser, or any laser having pulses in the femtosecond range.

Ablation mask 63 may be a patterned mask having pattern 62 manufactured using standard semiconductor lithography mask techniques. The patterned portions of ablation mask 63 are opaque to UV light, while a support substrate of ablation mask are transparent to UV light. In one embodiment, the patterned portions comprise aluminum while the support substrate for ablation mask 63 is fused silica ($SiO_2$). Fused silica is a useful support material because it is one of the few materials that is transparent to mid and far UV wavelengths. Aluminum is useful as a patterning material because it reflects mid-UV light. A patterned dielectric stack is one alternative to aluminum.

Imaging lens 64 may be a single lens or an entire optical system consisting of a number of lenses and other optical components. Imaging lens 64 projects an image of the ablation mask, more specifically, an image of the pattern of light passing through the ablation mask onto surface of object to be ablated 65. The object to be ablated is a web of polymeric film 66, possibly including a material 67 formed on the back side. Some suitable polymers include polyimide, polyester, polystyrene, polymethymethacrylate and polycarbonate. The material 67 formed on the back side of the polymeric film 66 may be formed over the entire polymeric film, or alternatively formed only in the local area of the film being ablated.

Figure 7:
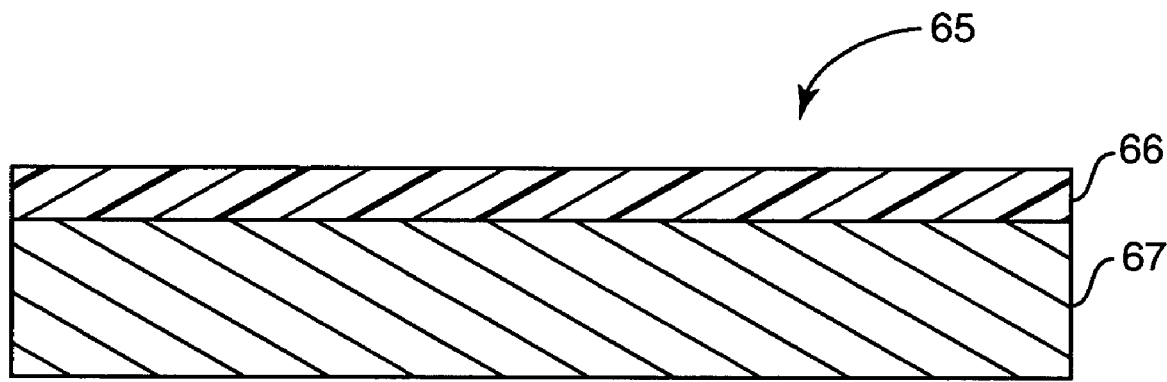
FIG. 7 is a cross-sectional side view of a web of polymeric film formed with a material on a first side.

FIG. 7 illustrates useful structures that can form the object 65 to be ablated. Specifically, FIG. 7 illustrates an object 65 to be ablated that includes a web of polymer film 66 with a material 67 formed on the back side, i.e. a side opposite the side incident to the laser in system 60. Again, material 67 may be formed over the entire polymeric film, or alternatively formed only in the local area of the film being ablated. Material 67 provides an etch stop for the ablation process which can avoid air entrapment under the web of polymer film 66. For example, material 67 may comprise a metal such as copper.

After the ablation is complete, material 67 can be etched from the web of polymer film 66, to form an aperture mask web. Alternatively, in some embodiments, material 67, may be peeled away. Objects 65 may be created by forming a copper layer on a web of polymer film, or by forming the web of polymer film on a copper layer. In some cases, objects 65 may simply be purchased in a preformed configuration. If formed, the copper layer may be formed over the full web of polymeric film, or simply over the portion of the web being ablated. In the later case, the copper layer may be formed over different portions of the web for subsequent ablation processes to ultimately define a web of polymeric film formed with a number of deposition patterns.

Referring again to FIG. 6, table 69 supports and positions the object to be ablated 65. For example, object to be ablated 65 can be fixed into position on table 69, such as by vacuum chuck 68, static electricity, mechanical fasteners or a weight. Table 69 can position the object to be ablated 65 by moving the object 65 on the x, y and z axes as well as rotationally, such as along the z axis. Table 69 can move object 65 in steps down to approximately 5 nm, and more typically, approximately 100 nm, reproducible to an accuracy of approximately 500 nm. Computer control of table 69 can allow preprogramming of the movement of table 69 as well as possible synchronization of table movement with the emission of light from laser 61. The table may also be manually controlled, such as with a joystick connected to a computer.

In creating aperture masks for integrated circuit fabrication, it can be advantageous to control the wall angle of the ablated deposition apertures so that the deposition apertures are suitable for material to be deposited through them. Accordingly, the invention may control the ablation so as to achieve an acceptable wall angle. A straight wall angle, i.e., a zero (0) degree wall angle, corresponds to a deposition aperture having walls that are perpendicular to the surface of the web of polymer film. In some cases, even a negative wall angle can be achieved, wherein the hole assumes a larger and larger diameter as the laser ablates through the web of polymer film.

In general, the aperture wall angle should be near zero to allow the closest possible spacing between apertures. However, if a large aperture mask is used in a deposition process with a small source, e.g., electron beam evaporation, a wall angle greater than zero is desirable to minimize parallax in regions of the mask where the deposition flux impinges the deposition substrate at an angle substantially different from perpendicular.

A number of factors can affect the wall angle. Accordingly these factors can be controlled to achieve an acceptable, or a desired wall angle. For example, the power density of the laser radiation at the substrate and the numerical aperture of the imaging system can be controlled to achieve an acceptable wall angle. Additional factors that may be controlled include the pulse length of the laser, and the ablation threshold of the object or material being ablated.

Figure 8:
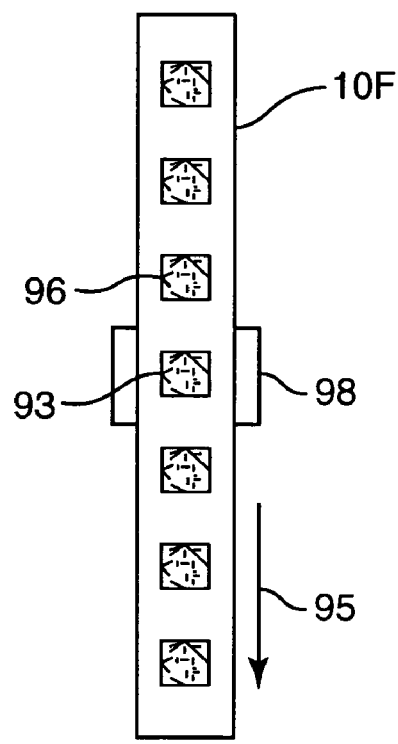
FIGS. 8 and 9 are simplified illustrations of in-line aperture mask deposition techniques.
Figure 9:
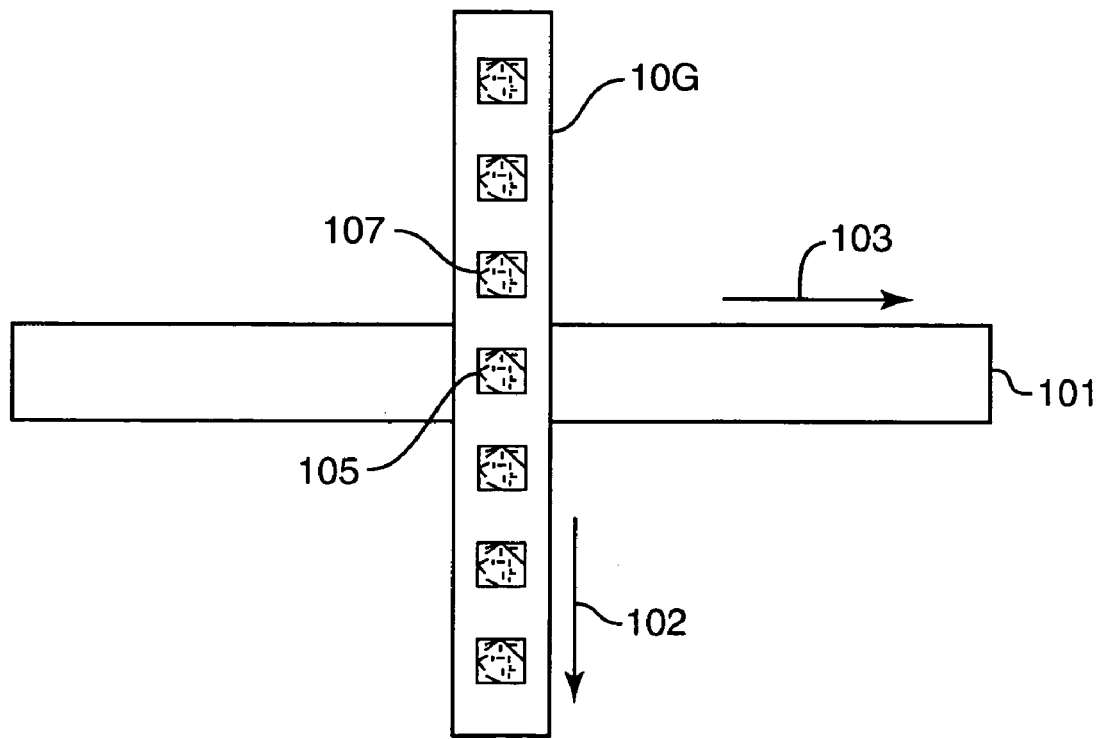

FIGS. 8 and 9 are simplified illustrations of in-line aperture mask deposition techniques. In FIG. 8, a web of polymeric film 10F formed with deposition mask patterns 96 and 93 travels past a deposition substrate 98. A first pattern 93 in the web of polymeric film 10F can be aligned with deposition substrate 98, and a deposition process can be performed to deposit material on deposition substrate 98 according to the first pattern 93. Then, the web of polymeric film 10F can be moved (as indicated by arrow 95) such that the a second pattern 96 aligns with the deposition substrate 98, and a second deposition process can be performed. The process can be repeated for any number of patterns formed in the web of polymeric film 10F. The deposition mask pattern of polymeric film 10F can be reused by repeating the above steps on a different deposition substrate or a different portion of the same substrate.

FIG. 9 illustrates another in-line aperture mask deposition technique. In the example of FIG. 9, the deposition substrate 101 may comprise a web. In other words, both the aperture mask 10G and the deposition substrate 101 may comprise webs, possibly made from polymeric material. Alternatively, deposition substrate web 101 may comprise a conveyance web carrying a series of discrete substrates. A first pattern 105 in the aperture mask web 10G can be aligned with deposition substrate web 101 for a first deposition process. Then, either or both the aperture mask web 10G and the deposition substrate web 101 can be moved (as indicated by arrows 102 and 103) such that a second pattern 107 in aperture mask web 10G is aligned with the deposition substrate web 101 and a second deposition process performed. If each of the aperture mask patterns in the aperture mask web 10G are substantially the same, the technique illustrated in FIG. 9 can be used to deposit similar deposition layers in a number of sequential locations along the deposition substrate web 101.

Figure 10:
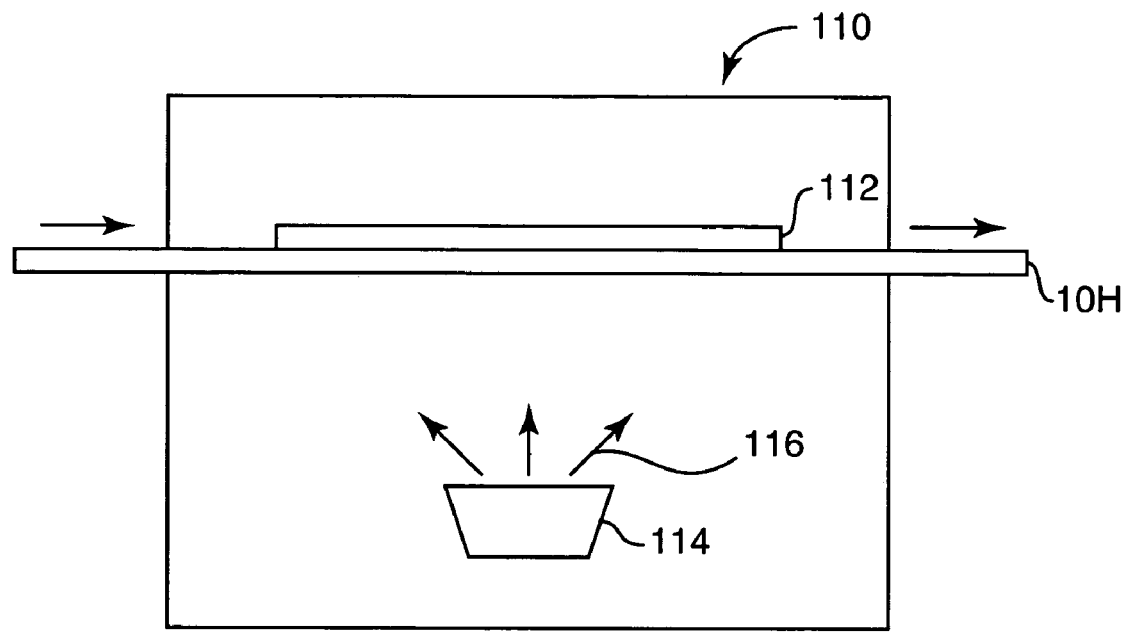
FIGS. 10 and 11 are block diagrams of deposition stations according to the invention.

FIG. 10 is a simplified block diagram of a deposition station that can use an aperture mask web in a deposition process according to the invention. In particular, deposition station 110 can be constructed to perform a vapor deposition process in which material is vaporized and deposited on a deposition substrate through an aperture mask. The deposited material may be any material including semiconductor material, dielectric material, or conductive material used to form a variety of elements within an integrated circuit. For example, organic or inorganic materials may be deposited. In some cases, both organic and inorganic materials can be deposited to create a circuit. In another example, amorphous silicon may be deposited. Deposition of amorphous silicon typically requires high temperatures greater than approximately 200 degrees Celsius. Some embodiments of polymeric webs described herein can withstand these high temperatures, thus allowing amorphous silicon to be deposited and patterned to create integrated circuits or integrated circuit elements. In another example, pentacene can be deposited.

A flexible web 10H formed with aperture mask patterns passes through deposition station 110 such that the mask can be placed in proximity with a deposition substrate 112. Deposition substrate 112 may comprise any of a variety of materials depending on the desired circuit to be created. For example, deposition substrate 112 may comprise a flexible material, such as a flexible polymer, e.g., polyimide or polyester, possibly forming a web. Additionally, if the desired circuit is a circuit of transistors for an electronic display such as a liquid crystal display, deposition substrate 112 may comprise the backplane of the electronic display. Any deposition substrates such as glass substrates, silicon substrates, rigid plastic substrates, metal foils coated with an insulating layer, or the like, could also be used. In any case, the deposition substrate may or may not include previously formed features.

Deposition station 110 is typically a vacuum chamber. After a pattern in aperture mask web 10H is secured in proximity to deposition substrate 112, material 116 is vaporized by deposition unit 114. For example, deposition unit 114 may include a boat of material that is heated to vaporize the material. The vaporized material 116 deposits on deposition substrate 112 through the deposition apertures of aperture mask web 10H to define at least a portion of a circuit layer on deposition substrate 112. Upon deposition, material 116 forms a deposition pattern defined by the pattern in aperture mask web 10H. Aperture mask web 10H may include apertures and gaps that are sufficiently small to facilitate the creation of small circuit elements using the deposition process as described above. Additionally, the pattern of deposition apertures in aperture mask web 10H may have a large dimension as mentioned above. Other suitable deposition techniques include e-beam evaporation, various forms of sputtering, and pulsed laser deposition.

However, when patterns in the aperture mask web 10H are made sufficiently large, for example, to include a pattern that has large dimensions, a sag problem may arise. In particular, when aperture mask web 10H is placed in proximity to deposition substrate 112, aperture mask web 10H may sag as a result of gravitational pull. This problem is most apparent when the aperture mask 10H is positioned underneath deposition substrate as shown in FIG. 10. Moreover, the sag problem compounds as the dimensions of aperture mask web 10H are made larger and larger.

The invention may implement one of a variety of techniques to address the sag problem or otherwise control sag in aperture masks during a deposition process. For example, the web of aperture masks may define a first side that can removably adhere to a surface of a deposition substrate to facilitate intimate contact between the aperture mask and the deposition substrate during the deposition process. In this manner, sag can be controlled or avoided. In particular, a first side of flexible aperture mask 10H may include a pressure sensitive adhesive. In that case, the first side can removably adhere to deposition substrate 112 via the pressure sensitive adhesive, and can then be removed after the deposition process, or be removed and repositioned as desired.

Another way to control sag is to use magnetic force. For example, referring again to FIG. 1, aperture mask 10A may comprise both a polymer and magnetic material. The magnetic material may be coated or laminated on the polymer, or can be impregnated into the polymer. For example, magnetic particles may be dispersed within a polymeric material used to form aperture mask 10A. When a magnetic force is used, a magnetic field can be applied within a deposition station to attract or repel the magnetic material in a manner that controls sag in aperture mask 10A.

Figure 11:
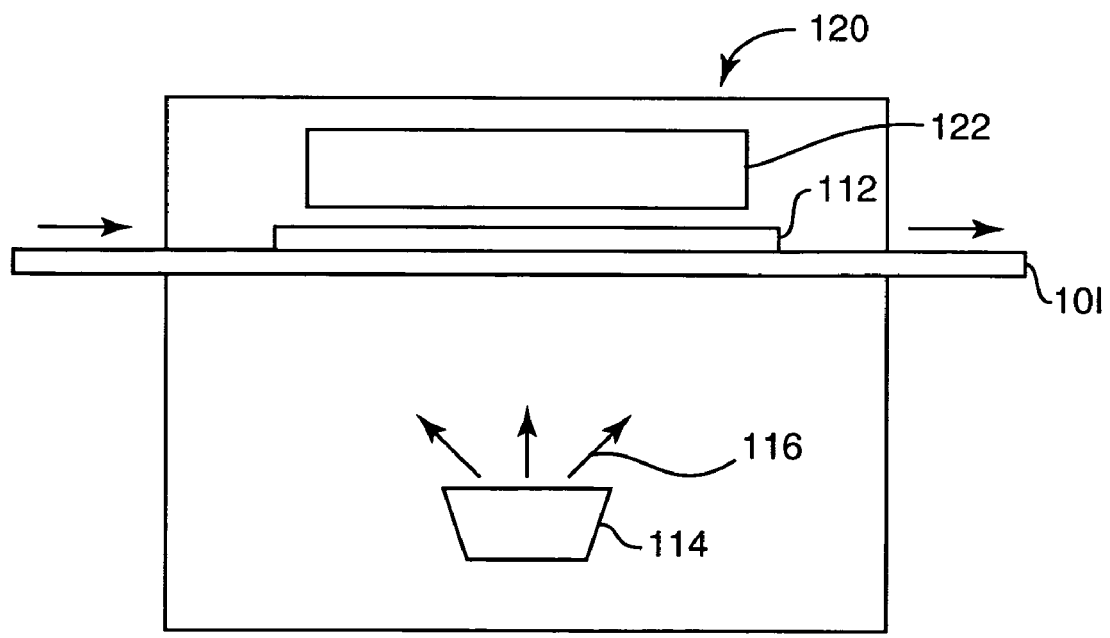

For example, as illustrated in FIG. 11, a deposition station 120 may include magnetic structure 122. Aperture mask 10I may be an aperture mask web that includes a magnetic material. Magnetic structure 122 may attract aperture mask web 10I so as to reduce, eliminate, or otherwise control sag in aperture mask web 10I. Alternatively, magnetic structure 122 may be positioned such that sag is controlled by repelling the magnetic material within aperture mask web 10I. In that case, magnetic structure 122 would be positioned on the side of aperture mask 10I opposite deposition substrate 112. For example, magnetic structure 122 can be realized by an array of permanent magnets or electromagnets.

Another way to control sag is the use of electrostatics. In that case, aperture mask 10A may comprise a web of polymeric film that is electrostatically coated. Although magnetic structure 122 (FIG. 11) may not be necessary if an electrostatic coating is used to control sag, it may be helpful in some cases where electrostatics are used. A charge may be applied to the aperture mask web, the deposition substrate web, or both to promote electrostatic attraction in a manner that promotes a sag reduction.

Still another way to control sag is to stretch the aperture mask. In that case, a stretching mechanism can be implemented to stretch the aperture mask by an amount sufficient to reduce, eliminate, or otherwise control sag. As the mask is stretched tightly, sag is reduced. In that case, the aperture mask may need to have an acceptable coefficient of elasticity. As described in greater detail below, stretching in a cross-web direction, a down-web direction, or both can be used to reduce sag and to align the aperture mask. In order to allow ease of alignment using stretching, the aperture mask can allow elastic stretching without damage. The amount of stretching in one or more directions may be greater than 0.1 percent, or even greater than 1 percent. Additionally, if the deposition substrate is a web of material, it too can be stretched for sag reduction and/or alignment purposes. Also, the aperture mask web, the deposition substrate web, or both may include distortion minimizing features, such as perforations, reduced thickness ares, slits, or similar features, which facilitate more uniform stretching. The slits can be added near the edges of the patterned regions of the webs and may provide better control of alignment and more uniform stretching when the webs are stretched. The slits may be formed to extend in directions parallel to the directions that the webs are stretched.

Figure 12A:
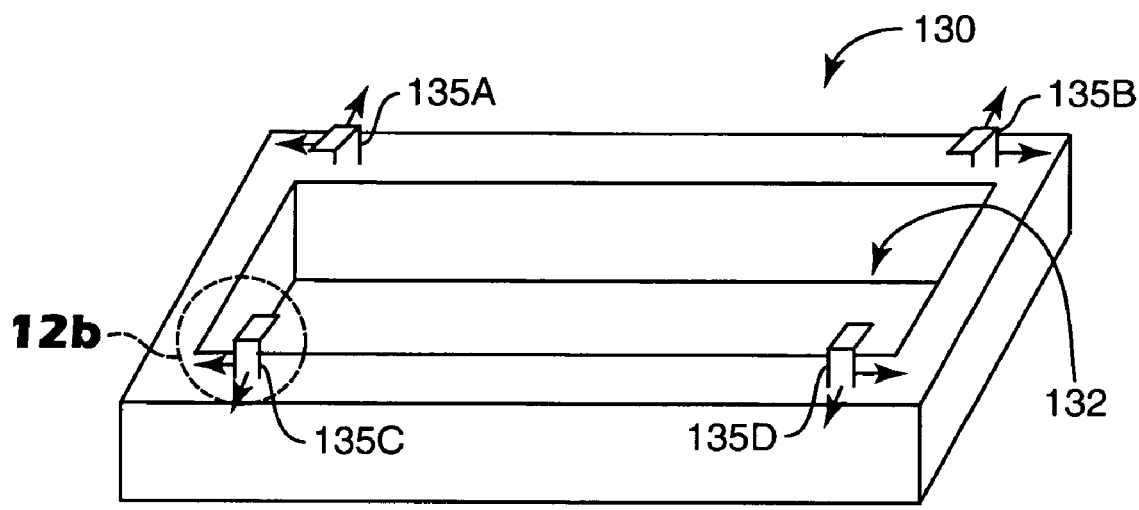
FIG. 12a is a perspective view of one exemplary stretching apparatus according to an embodiment of the invention.

FIG. 12a is a perspective view of an exemplary stretching apparatus for stretching aperture mask webs in accordance with the invention. Stretching can be performed in a down-web direction, a cross-web direction, or both the cross and down-web directions. Stretching unit 130 may include a relatively large deposition hole 132. An aperture mask can cover deposition hole 132 and a deposition substrate can be placed in proximity with the aperture mask. Material can be vaporized up through deposition hole 132, and deposited on the deposition substrate according to the pattern defined in the aperture mask.

Figure 12B:
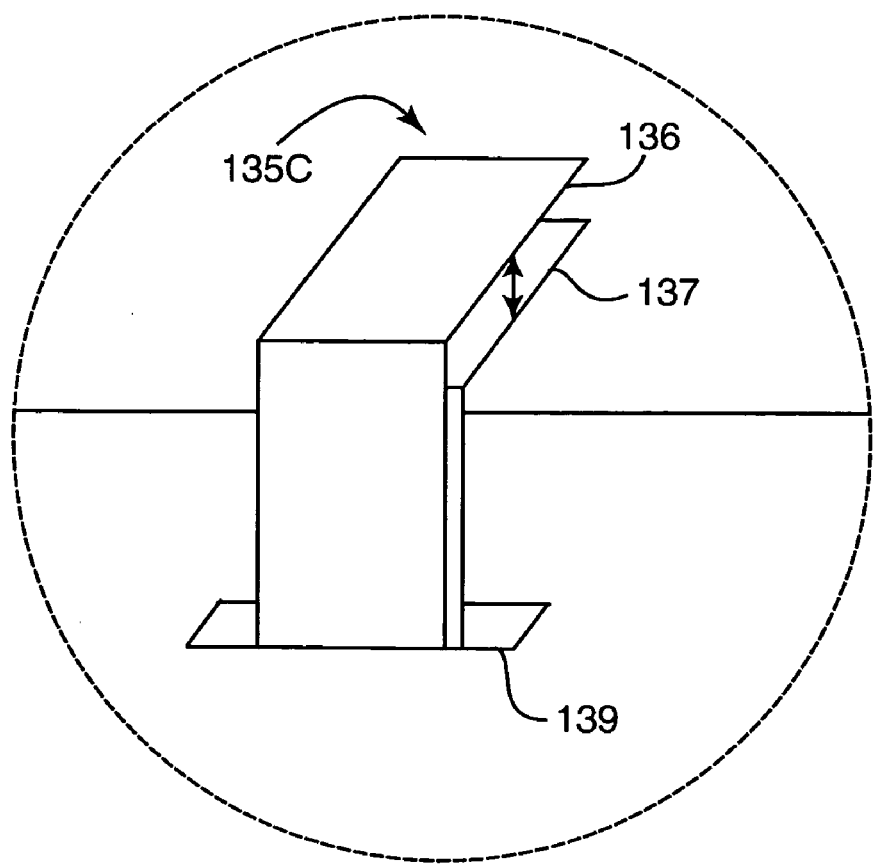
FIG. 12b is an enlarged view of a stretching mechanism.

Stretching apparatus 130 may include a number of stretching mechanisms 135A, 135B, 135C and 135D. Each stretching mechanism 135 may protrude up through a stretching mechanism hole 139 shown in FIG. 12b. In one specific example, each stretching mechanism 135 includes a top clamp portion 136 and a bottom clamp portion 137 that can clamp together upon an aperture mask. The aperture mask can then be stretched by moving stretching mechanisms 135 away from one another as they clamp the aperture mask. The movement of the stretching mechanisms can define whether the aperture mask is stretched in a down-web direction, a cross-web direction, or both. Stretching mechanisms 135 may move along one or more axes.

Stretching mechanisms 135 are illustrated as protruding from the top of stretching apparatus 130, but could alternatively protrude from the bottom of stretching apparatus 130. Particularly, if stretching apparatus 130 is used to control sag in an aperture mask, the stretching mechanisms would typically protrude from the bottom of stretching apparatus 130. Alternative methods of stretching the aperture mask could also be used either to control sag in the aperture mask or to properly align the aperture mask for the deposition process. A similar stretching mechanism could also be used to stretch a deposition substrate web.

Figure 13:
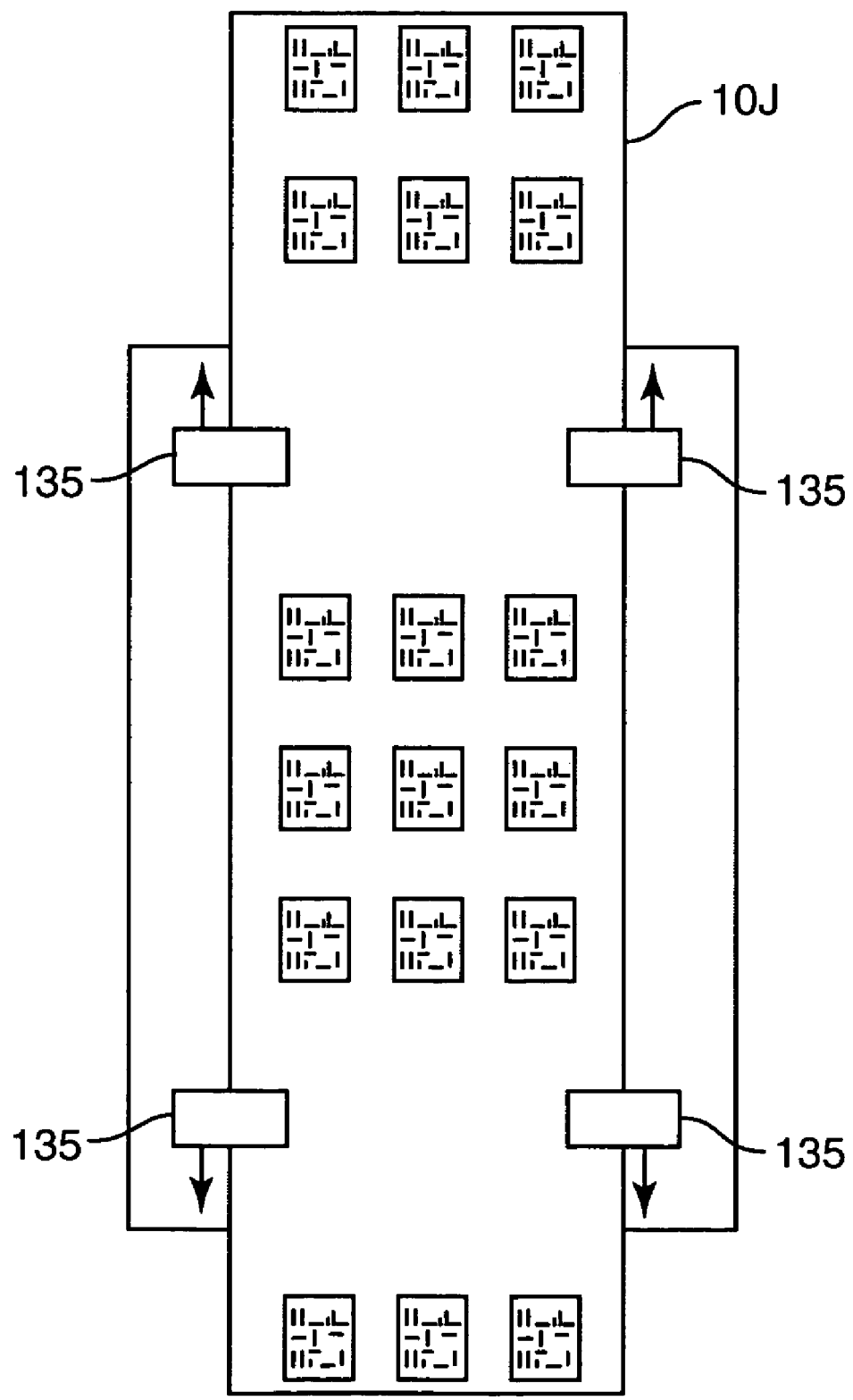
FIGS. 13-15 are top views of exemplary stretching apparatuses according to embodiments of the invention.
Figure 14:
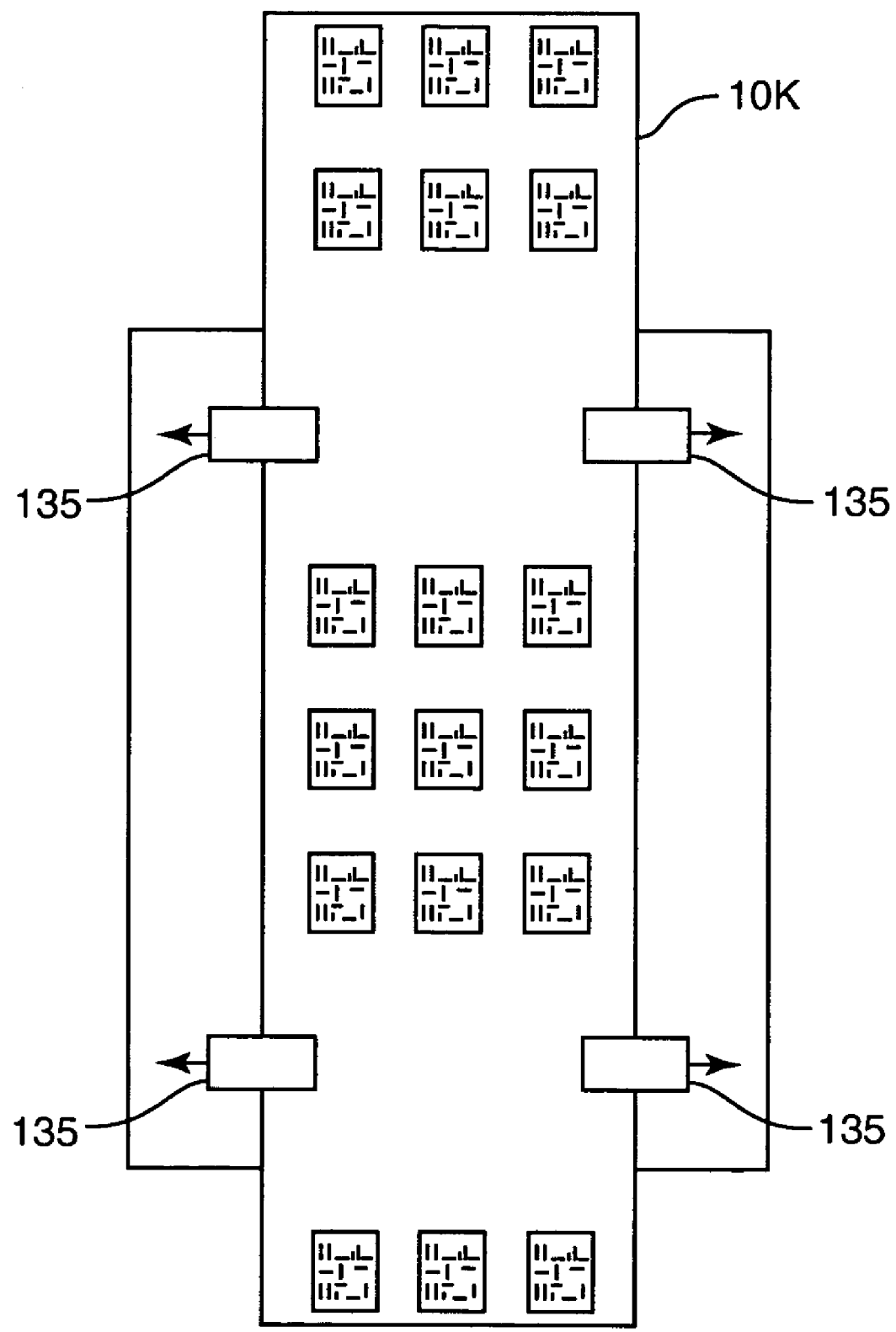

FIGS. 13 and 14 are top views of stretching apparatuses illustrating the stretching of aperture masks in a down-web direction (FIG. 13) and a cross-web direction (FIG. 14). As illustrated in FIG. 13, stretching mechanisms 135 clamp upon aperture mask web 10J, and then move in a direction indicated by the arrows to stretch aperture mask web 10J in a down-web direction. Any number of stretching mechanisms 135 may be used. In FIG. 14, stretching mechanisms 135 stretch aperture mask web 10K in a cross-web direction as indicated by the arrows. Additionally, stretching in both a cross-web direction and a down-web direction can be implemented. Indeed, stretching along any of one or more defined axes can be implemented.

Figure 15:
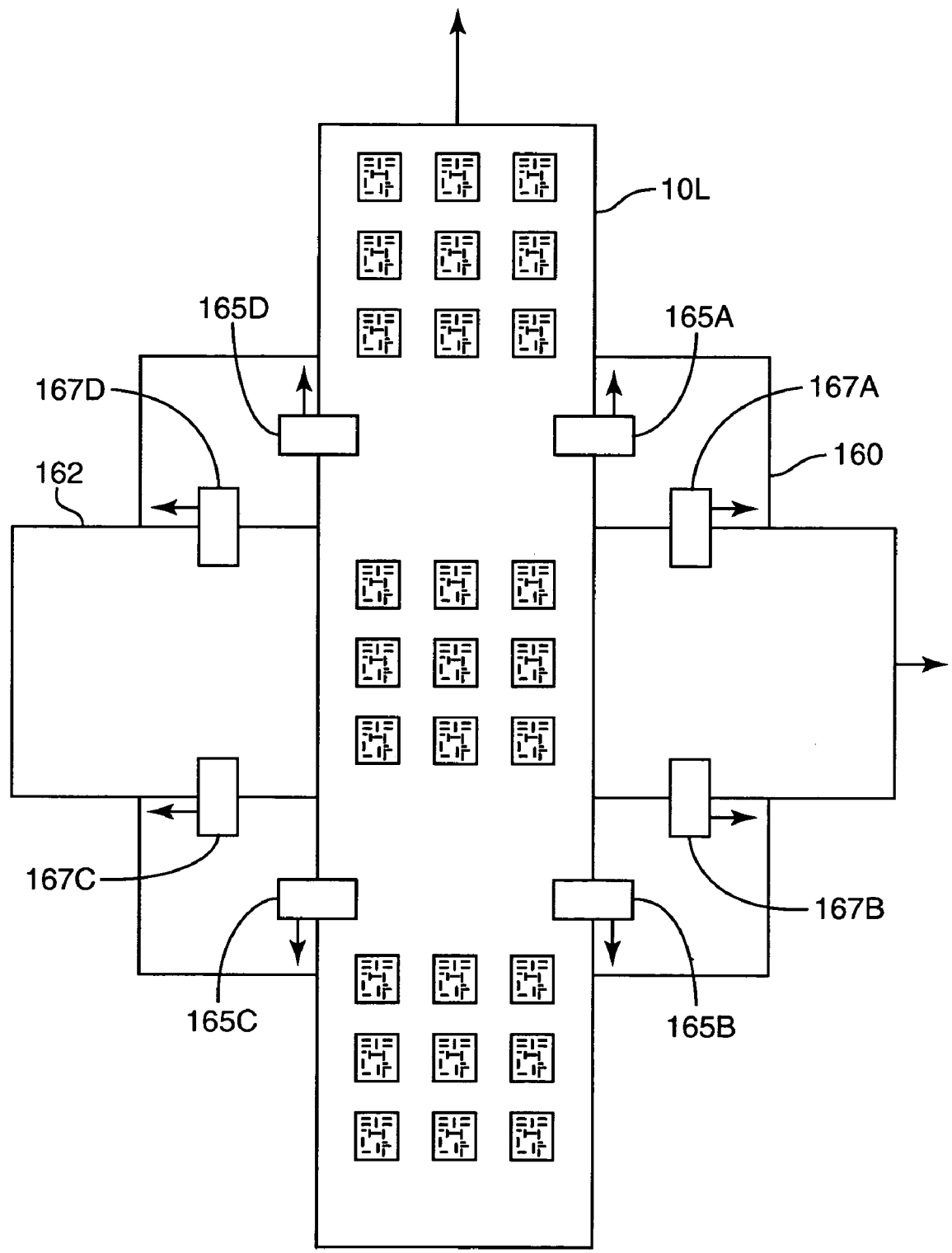

FIG. 15 is a top view of a stretching apparatus 160 that can be used to stretch both an aperture mask web 10L and a deposition substrate web 162. In particular, stretching apparatus 160 includes a first set of stretching mechanisms 165A-165D that clamp upon aperture mask web 10L to stretch aperture mask web 10L. Also, stretching apparatus 160 includes a second set of stretching mechanisms (167A-167D) that clamp upon deposition substrate web 162 to stretch deposition substrate web 162. The stretching can reduce sag in the webs 10L and 162, and can also be used to achieve precise alignment of aperture mask web 10L and deposition substrate web 162. Although the arrows illustrate stretching in a down-web direction, stretching in a cross-web direction or both a down-web and a cross-web direction may also be implemented according to the invention.

Figure 16:
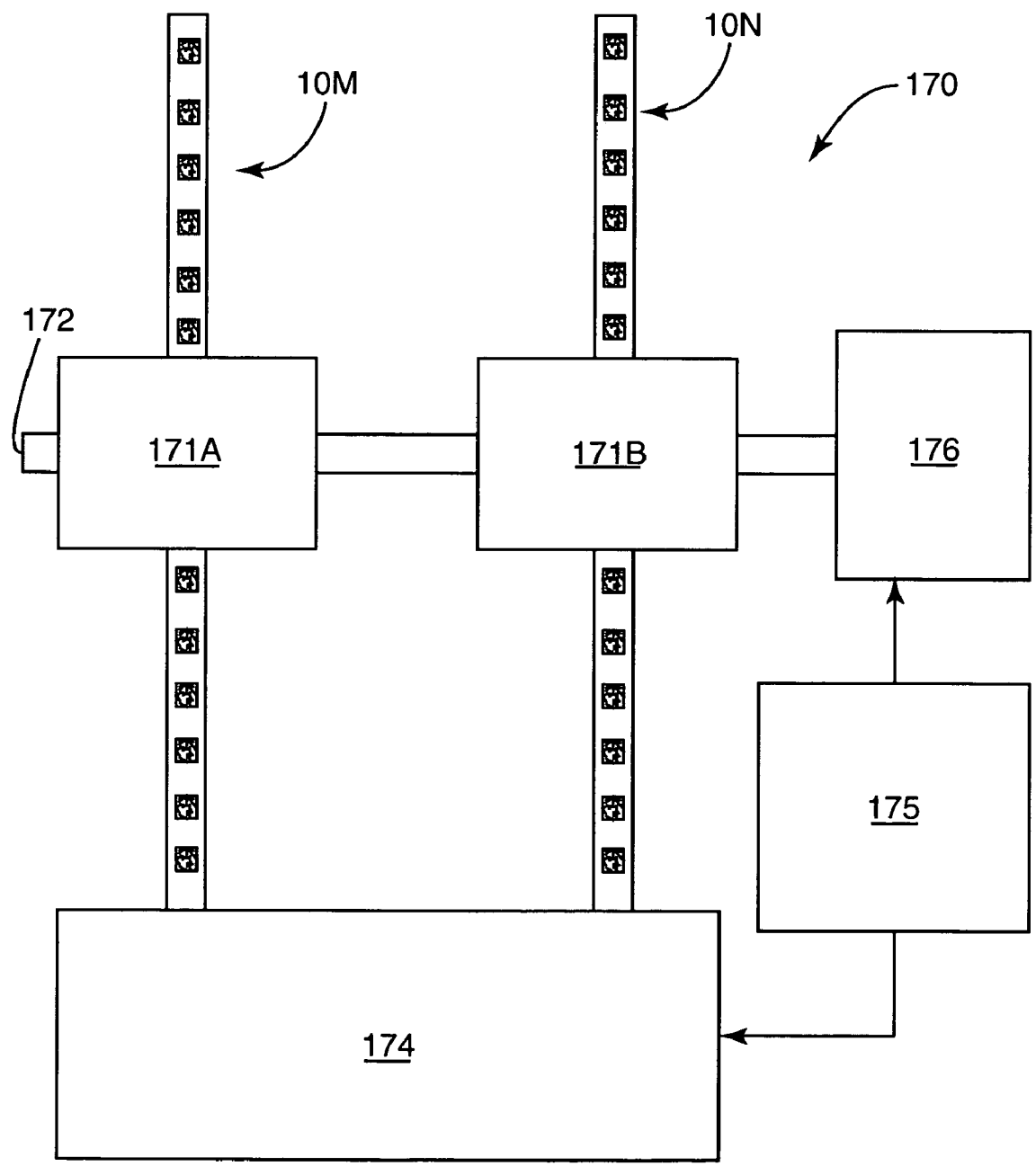
FIG. 16 is a block diagram of an exemplary in-line deposition system according to an embodiment of the invention.

FIG. 16 is a block diagram of an in-line deposition system 170 according to an embodiment of the invention. As shown, in-line deposition system 170 includes a number of deposition stations 171A-171B (hereafter deposition stations 171). Deposition stations 171 deposit material on a deposition substrate web at substantially the same time. Then, after a deposition, the deposition substrate 172 moves such that subsequent depositions can be performed. Each deposition station also has an aperture mask web that feeds in a direction such that it crosses the deposition substrate. Typically, the aperture mask web feeds in a direction perpendicular to the direction of travel of the deposition substrate. For example, aperture mask web 10M may be used by deposition station 171 A, and aperture mask web 10N may be used by deposition station 171B. Each aperture mask web 10 may include one or more of the features outlined above. Although illustrated as including two deposition stations, any number of deposition stations can be implemented in an in-line system according to the invention. Multiple deposition substrates may also pass through one or more of the deposition stations.

Deposition system 170 may include drive mechanisms 174 and 176 to move the aperture mask webs 10 and the deposition substrate 172, respectively. For example, each drive mechanism 174, 176 may implement one or more magnetic clutch mechanisms to drive the webs and provide a desired amount of tension. Control unit 175 can be coupled to drive mechanisms 174 and 176 to control the movement of the webs in deposition system 170. The system may also include one or more temperature control units to control temperature within the system. For example, a temperature control unit can be used to control the temperature of the deposition substrate within one or more of the deposition stations. The temperature control may ensure that the temperature of the deposition substrate does not exceed 250 degrees Celsius, or does not exceed 125 degrees Celsius.

Additionally, control unit 175 may be coupled to the different deposition stations 171 to control alignment of the aperture mask webs 10 and the deposition substrate web 172. In that case, optical sensors and/or motorized micrometers may be implemented with stretching apparatuses in deposition stations 171 to sense and control alignment during the deposition processes. In this manner, the system can be completely automated to reduce human error and increase throughput. After all of the desired layers have been deposited on deposition substrate web 172, the deposition substrate web 172 can be cut or otherwise separated into a number of circuits. The system can be particularly useful in creating low cost integrated circuits such as radio frequency identification (RFID) circuits.

Figure 17:
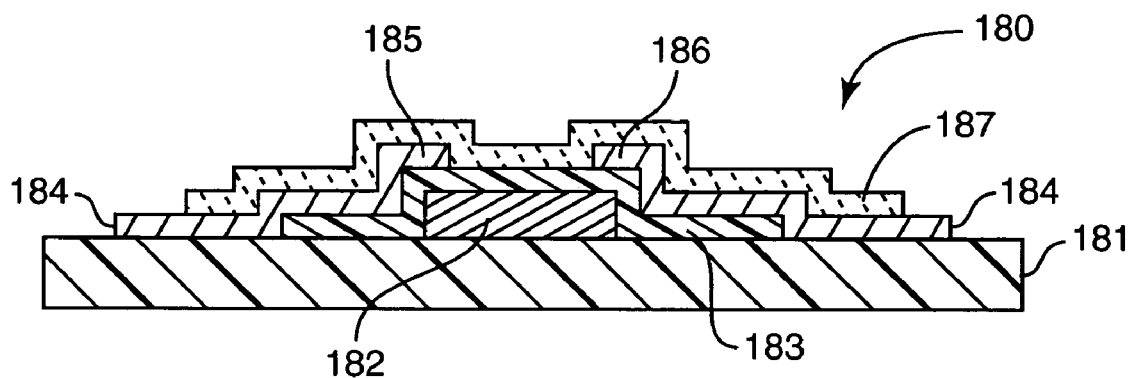
FIGS. 17 and 18 are cross-sectional views of exemplary thin film transistors that can be created according to the invention.
Figure 18:
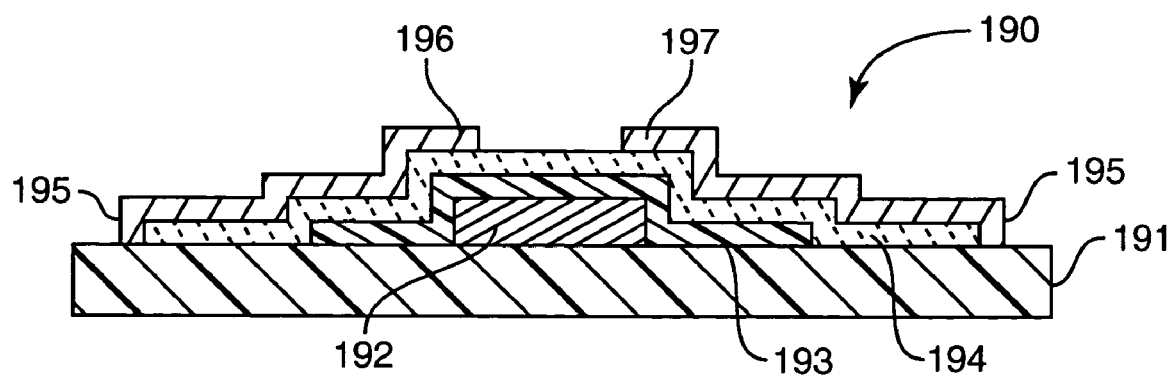

FIGS. 17 and 18 are cross-sectional views of exemplary thin film transistors that can be created according to the invention. In accordance with the invention, thin film transistors 180 and 190 can be created without using photolithography in an additive or subtractive process. Instead, thin film transistors 180 and 190 can be created solely using aperture mask deposition techniques as described herein. Alternatively, one or more bottom layers may be photolithographically patterned in an additive or subtractive process, with at least two of the top most layers being formed by the aperture mask deposition techniques described herein. Importantly, the aperture mask deposition techniques achieve sufficiently small circuit features in the thin film transistors. Advantageously, if an organic semiconductor is used, the invention can facilitate the creation of thin film transistors in which the organic semiconductor is not the top-most layer of the circuit. Rather, in the absence of photolithography, electrode patterns may be formed over the organic semiconductor material. This advantage of aperture mask 10 can be exploited while at the same time achieving acceptable sizes of the circuit elements, and in some cases, improved device performance.

An additional advantage of this invention is that an aperture mask may be used to deposit a patterned active layer which may enhance device performance, particularly in cases where the active layer comprises an organic semiconductor, for which conventional patterning processes are incompatible. In general, the semiconductor may be amorphous (e.g., amorphous silicon) or polycrystalline (e.g., pentacene).

Thin film transistors are commonly implemented in a variety of different circuits, including, for example, RFID circuits and other low cost circuits. In addition, thin film transistors can be used as control elements for liquid crystal display pixels, or other flat panel display pixels such as organic light emitting diodes. Many other applications for thin film transistors also exist.

As shown in FIG. 17, thin film transistor 180 is formed on a deposition substrate 181. Thin film transistor 180 represents one embodiment of a transistor in which all of the layers are deposited using an aperture mask and none of the layers are formed using etching or lithography techniques. The aperture mask deposition techniques described herein can enable the creation of thin film transistor 180 in which a distance between the electrodes is less than approximately 1000 microns, less than approximately 50 microns, less than approximately 20 microns, or even less than approximately 10 microns, while at the same time avoiding conventional etching or photolithographic processes.

In particular, thin film transistor 180 includes a first deposited conductive layer 182 formed over deposition substrate 181. A deposited dielectric layer 183 is formed over first conductive layer 182. A second deposited conductive layer 184 defining source electrode 185 and drain electrode 186 is formed over deposited dielectric layer 183. A deposited active layer 187, such as a deposited semiconductor layer, or a deposited organic semiconductor layer is formed over second deposited conductive layer 184.

Aperture mask deposition techniques using an in-line deposition system, represent one exemplary method of creating thin film transistor 180. In that case, each layer of thin film transistor 180 may be defined by one or more deposition apertures in a flexible aperture mask web 10. Alternatively, one or more of the layers of the thin film transistor may be defined by a number of different patterns in aperture mask web 10. In that case, stitching techniques, as mentioned above, may be used.

By forming deposition apertures 14 in aperture mask webs 10 to be sufficiently small, one or more features of thin film transistor 180 can be made less than approximately 1000 microns, less than approximately 50 microns, less than 20 microns, less than 10 microns, or even less than 5 microns. Moreover, by forming a gap in aperture mask webs 10 to be sufficiently small, other features such as the distance between source electrode 185 and drain electrode 186 can be made less than approximately 1000 microns, less than approximately 50 microns, less than 20 microns or even less than 10 microns. In that case, a single mask pattern may be used to deposit second conductive layer 184, with each of the two electrodes 185, 186 being defined by deposition apertures separated by a sufficiently small gap, such as a gap less than approximately 1000 microns, less than approximately 50 microns, less than approximately 20 microns or a gap less than approximately 10 microns. In this manner, the size of thin film transistor 180 can be reduced, enabling fabrication of smaller, higher density circuitry while improving the performance of thin film transistor 180. Additionally, a circuit comprising two or more transistors, like that illustrated in FIG. 17 can be formed by an aperture mask web having two deposition apertures of a pattern separated by a large distance, as illustrated in FIGS. 3 and 4.

FIG. 18 illustrates another embodiment of a thin film transistor 190. In particular, thin film transistor 190 includes a first deposited conductive layer 192 formed over deposition substrate 191. A deposited dielectric layer 193 is formed over first conductive layer 192. A deposited active layer 194, such as a deposited semiconductor layer, or a deposited organic semiconductor layer is formed over deposited dielectric layer 193. A second deposited conductive layer 195 defining source electrode 196 and drain electrode 197 is formed over deposited active layer 194.

Again, by forming deposition apertures 14 in aperture mask webs 10 to be sufficiently small, one or more features of thin film transistor 190 can have widths on the order of those discussed herein. Also, by forming a gap between apertures in aperture mask webs 10 to be sufficiently small, the distance between source electrode 196 and drain electrode 197 can be on the order of the gap sizes discussed herein. In that case, a single mask pattern may be used to deposit second conductive layer 195, with each of the two electrodes 196, 197 being defined by deposition apertures separated by a sufficiently small gap. In this manner, the size of thin film transistor 190 can be reduced, and the performance of thin film transistor 190 improved.

Thin film transistors implementing organic semiconductors generally take the form of FIG. 17 because organic semiconductors cannot be etched or lithographically patterned without damaging or degrading the performance of the organic semiconductor material. For instance, morphological changes can occur in an organic semiconductor layer upon exposure to processing solvents. For this reason, fabrication techniques in which the organic semiconductor is deposited as a top layer may be used. The configuration of FIG. 18 is advantageous because top contacts to the electrodes provide a low-resistance interface.

By forming at least the top two layers of the thin film transistor using aperture mask deposition techniques, the invention facilitates the configuration of FIG. 18, even if active layer 194 is an organic semiconductor layer. The configuration of FIG. 18 can promote growth of the organic semiconductor layer by allowing the organic semiconductor layer to be deposited over the relatively flat surface of dielectric layer 193, as opposed to being deposited over the non-continuous second conductive layer 184 as illustrated in FIG. 17. For example, if the organic semiconductor material is deposited over a non-flat surface, growth can be inhibited. Thus, to avoid inhibited organic semiconductor growth, the configuration of FIG. 18 may be desirable. In some embodiments, all of the layers may be deposited as described above. Also, the configuration of FIG. 18 is advantageous because depositing appropriate source and drain electrodes on the organic semiconductor provides low-resistance interfaces. Additionally, circuits having two or more transistors separated by a large distance can also be created, for example, using aperture mask webs like those illustrated in FIGS. 3 and 4.

A number of embodiments of the invention have been described. For example, a number of different structural components and different aperture mask deposition techniques have been described for realizing an in-line deposition system. The deposition techniques can be used to create various circuits solely using deposition, avoiding any chemical etching processes or photolithography, which is particularly useful when organic semiconductors are involved. Moreover, the system can be automated to reduce human error and increase throughput. Nevertheless, it is understood that various modifications can be made without departing from the spirit and scope of the invention. For example, although some aspects of the invention have been described for use in a thermal vapor deposition process, the techniques and structural apparatuses described herein could be used with any deposition process including sputtering, thermal evaporation, electron beam evaporation and pulsed laser deposition. Thus, these other embodiments are within the scope of the following claims.

The invention claimed is:
1. A method of forming at least a portion of an integrated circuit, said method comprising:
positioning just and second webs of film in proximity to each other, wherein the second web of film comprises a polymeric material and defines a deposition mask pattern in a first area of the second web of film; and
deposition a material on a first area of the first web of film through the deposition mask pattern defined by the second web of film to create at least a portion of a circuit feature of an integrated circuit, said circuit feature being selected from the group consisting of a first conductor, a dielectric, source and drain electrodes, and a semiconductor.
2. The method of claim 1, further comprising:
positioning a different area of the first web of film and the deposition mask pattern of the second web of film in proximity to each other; and
depositing a material on the different area of the first web of film through the deposition mask pattern.
3. The method of claim 1, further comprising:
positioning a third web of film and the deposition mask pattern of the second web of film in proximity to each other; and
depositing a material on the third web of film through the deposition mask pattern defined by the second web of film to create at least a portion of an integrated circuit on the third web of film.
4. The method of claim 1, further comprising:
position the first web of film and a third web of film in proximity in each other wherein the third web of film is formed with another deposition mask pattern; and
depositing another material on at least a portion of the first area of the first web of film through the deposition mask pattern on the third web or film to create another portion of the integrated circuit on the first web of film.
5. The method of claim 1, further comprising:
positioning the first web of film and each of a number of webs of film formed with deposit mask patterns in proximity to one another; and sequentially depositing materials on the first web of film through the deposition mask patterns to create the integrated circuit on the first web of film.
6. The method of claim 5, further comprising creating a number of integrated circuits on the first web of film.
7. The method of claim 6, further comprising separating the number of integrated circuits.
8. The method of claim 7, wherein the integrated circuits comprise radio frequency identification (RFID) circuits.
9. The method of claim 1, further comprising:
stretching one or both of the first web of film and the second web of film in down-web directions, cross-web directions, or both to align the deposition mask pattern relative to the first area of the first web of film prior to said depositing step.
10. The method of claim 1, wherein the second web of film comprises a plurality of deposition mask patterns, and said method further comprises:
positioning the second web of film comprises a plurality of deposition mask patterns over the first area of the first web of film;
depositing additional material on at least a portion of the first area of the first web of film through a deposition mask pattern defined by the second web of film to create another portion of the integrated circuit;
repeating said positioning and depositing steps one or more times, wherein the additional material comprises inorganic semiconductor material, organic semiconductor material, dielectric material, conductive material, amorphous silicon, pentacene, or a combination thereof.
11. The method of claim 1, wherein said method forms an integrated circuit.
12. The method of claim 11, wherein the integrated circuit comprises a transistor.
13. The method claim 1, wherein said method is capable of (i) providing circuit features having a dimension less than 5 microns, and (ii) providing two or more circuit features separated from one another by less than 10 microns.
14. A method of forming an integrated circuit, said method comprising:
positioning a deposition substrate and one or more webs of film in proximity to each other, wherein each of the one or more webs of film (i) comprises a polymeric material and (ii) defines one or more deposition mask patterns therein; and
sequentially depositing a conductive layer, a dielectric layer, a second conductive layer, and an active layer on the deposition substrate through the one or more deposition mask patterns defined by the one or more webs of film to create an electrically conductive integrated circuit.
15. The method of claim 14, wherein said method of forming an integrated circuit does not require any etching or photolithography steps to form the integrated circuit.
16. The method of claim 14, wherein the integrated circuit comprises a transistor.
17. The method of claim 14, wherein the active layer comprises organic semiconductor material.
18. A method of forming an integrated circuit, said method comprising:
positioning a deposition substrate and one or more webs of film in proximity to each other, wherein each of the one or more webs of film (i) comprises a polymeric material and (ii) defines one or more deposition mask patterns therein; and sequentially depositing a conductive layer, a dielectric layer, an active layer, and a second conductive layer on the deposition substrate through the one or more deposition musk patterns defined by the one or more webs of film to create an electrically conductive integrated circuit.

19. The method of claim 18, wherein said method of forming an integrated circuit does not require any etching or photolithography steps to form the integrated circuit.

20. The method of claim 18, wherein the active layer comprises organic semiconductor material.

* * * * *

UNITED STATES PATENT AND TRADEMARK OFFICE
CERTIFICATE OF CORRECTION

| | | |
|---|---|---|
| PATENT NO. | : 7,297,361 B2 | |
| APPLICATION NO. | : 10/940448 | |
| DATED | : November 20, 2007 | |
| INVENTOR(S) | : Paul F. Baude | |

It is certified that error appears in the above-identified patent and that said Letters Patent is hereby corrected as shown below:

On the Title Page,
Item [57], line 4 in the Abstract, delete "deposition" and insert -- depositing --, therefor.

Item [57], line 5 in the Abstract, delete second occurrence of "the" and insert -- film --, therefor.

On the Title Page, Item (56) page 2, line 9, under "Other Publications", delete "of" and insert -- on --, therefor.

Column 13,
Lines 53-61, delete "Aperture mask deposition…..may be used." and insert the same on Line 52 after "184." as continuation of same paragraph.

Column 15,
Line 30, in claim 1, delete "just" and insert -- first --, therefor.

Line 34, in claim 1, delete "deposition" and insert -- depositing --, therefor.

Line 57, in claim 4, delete "position" and insert -- positioning --, therefor.

Line 58, in claim 4, delete "in" and insert -- to --, therefor.

Line 58, in claim 4, after "other" insert -- , --.

Line 62, in claim 4, delete "or" and insert -- of --, therefor.

Line 66, in claim 5, delete "deposit" and insert -- deposition --, therefor.

Column 16,
Line 38, in claim 13, after "method" insert -- of --.

UNITED STATES PATENT AND TRADEMARK OFFICE
CERTIFICATE OF CORRECTION

PATENT NO. : 7,297,361 B2
APPLICATION NO. : 10/940448
DATED : November 20, 2007
INVENTOR(S) : Paul F. Baude It is certified that error appears in the above-identified patent and that said Letters Patent is hereby corrected as shown below:

Column 17,
Line 6, in claim 18, delete "musk" and insert -- mask --, therefor.

Signed and Sealed this

Twenty-second Day of July, 2008

JON W. DUDAS
*Director of the United States Patent and Trademark Office*